(12) United States Patent
Abbaspour

(10) Patent No.: US 12,520,425 B2
(45) Date of Patent: Jan. 6, 2026

(54) THREE-DIMENSIONAL CIRCUITS WITH FLEXIBLE INTERCONNECTS

(71) Applicant: DUJUD LLC, Atlanta, GA (US)

(72) Inventor: Reza Abbaspour, Atlanta, GA (US)

(73) Assignee: DUJUD LLC, Atlanta, GA (US)

( * ) Notice: Subject to any disclaimer, the term of this patent is extended or adjusted under 35 U.S.C. 154(b) by 621 days.

(21) Appl. No.: 17/717,401

(22) Filed: Apr. 11, 2022

(65) Prior Publication Data

US 2022/0240383 A1   Jul. 28, 2022

Related U.S. Application Data

(63) Continuation-in-part of application No. 17/244,399, filed on Apr. 29, 2021, now Pat. No. 11,304,303.
(Continued)

(51) Int. Cl.
*H05K 1/02* (2006.01)
*H01L 21/48* (2006.01)
(Continued)

(52) U.S. Cl.
CPC ............ *H05K 1/118* (2013.01); *H01L 21/481* (2013.01); *H01L 21/4846* (2013.01); *H01L 24/72* (2013.01); *H05K 1/028* (2013.01); *H05K 1/0284* (2013.01); *H05K 3/1258* (2013.01); *H05K 3/14* (2013.01); *H05K 3/4007* (2013.01); *H01L 2224/72* (2013.01); *H10F 39/10* (2025.01)

(58) Field of Classification Search
CPC ... H01L 21/481; H01L 21/4846; H01L 24/72; H01L 2224/72; H05K 3/0035; H05K 1/118; H05K 1/028; H05K 1/0284; H05K 3/1258; H05K 3/4007; H05K 3/14; H10F 39/10
See application file for complete search history.

(56) References Cited

U.S. PATENT DOCUMENTS

| 4,218,532 A | 8/1980 | Dunkleberger |
| 4,497,684 A | 2/1985 | Sebesta |

(Continued)

FOREIGN PATENT DOCUMENTS

| JP | 2007294873 A | * 11/2007 |
| JP | 2013061457 A | 4/2013 |

(Continued)

OTHER PUBLICATIONS

Baerg et al., "Selective removal of dielectrics from integrated circuits for electron beam probing," 30th Annual Proceedings Reliability Physics 1992, San Diego, CA, USA, 1992, pp. 320-326. (Year: 1992).*

*Primary Examiner* — A. Dexter Tugbang
(74) *Attorney, Agent, or Firm* — TROUTMAN PEPPER LOCKE LLP; Mark Lehi Jones

(57) ABSTRACT

Three-dimensional (3D) devices that include at least two electrically isolated planes of electrically conductive traces and methods of making the same. The 3D device includes an upper level, a lower level electrically isolated from the upper level, and one or more pedestal portions joining the upper level and the lower level. The pedestal portions comprise an undercut. The undercut defines an upper level overhang that is configured to define a mask region to prevent conductive material from being deposited below the undercut.

20 Claims, 13 Drawing Sheets

Related U.S. Application Data

(60) Provisional application No. 63/018,001, filed on Apr. 30, 2020.

(51) Int. Cl.
    *H01L 23/00*     (2006.01)
    *H05K 1/11*     (2006.01)
    *H05K 3/12*     (2006.01)
    *H05K 3/14*     (2006.01)
    *H05K 3/40*     (2006.01)
    *H10F 39/10*     (2025.01)

(56) References Cited

U.S. PATENT DOCUMENTS

| | | |
|---|---|---|
| 4,606,998 A | 8/1986 | Clodgo et al. |
| 4,770,897 A | 9/1988 | Wu |
| 4,770,921 A | 9/1988 | Wacker et al. |
| 5,091,288 A * | 2/1992 | Zappella .............. H05K 3/4007 430/311 |
| 5,461,202 A * | 10/1995 | Sera ...................... H05K 1/181 174/262 |
| 5,863,447 A | 1/1999 | Coteus et al. |
| 7,960,097 B2 | 6/2011 | Chau et al. |
| 10,254,499 B1 | 4/2019 | Cohen et al. |
| 2004/0256731 A1 | 12/2004 | Mao et al. |
| 2006/0040567 A1 | 2/2006 | Bernier et al. |
| 2007/0191540 A1 | 8/2007 | Nunoshige et al. |
| 2009/0029065 A1 | 1/2009 | Terada et al. |
| 2009/0185357 A1 | 7/2009 | Rendek, Jr. et al. |
| 2015/0077961 A1* | 3/2015 | Thiesen ................ H05K 3/14 361/765 |
| 2015/0319867 A1* | 11/2015 | Sato ...................... H05K 1/118 428/327 |
| 2016/0249463 A1* | 8/2016 | Yoshida ............... H05K 3/0035 |
| 2018/0366344 A1* | 12/2018 | Huang ................. H01L 21/481 |
| 2020/0045832 A1 | 2/2020 | Hikmet et al. |

FOREIGN PATENT DOCUMENTS

| | | |
|---|---|---|
| WO | 2007095439 A2 | 8/2007 |
| WO | 2019241286 A1 | 12/2019 |

* cited by examiner

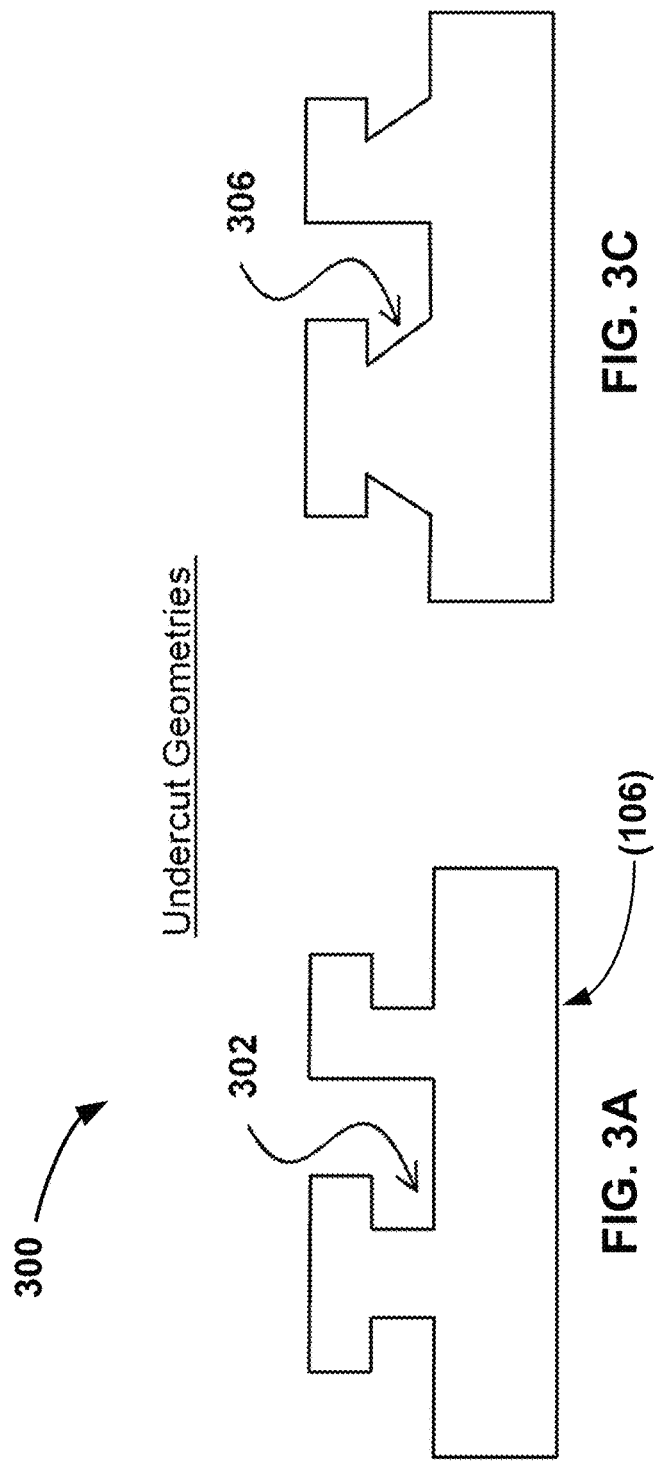
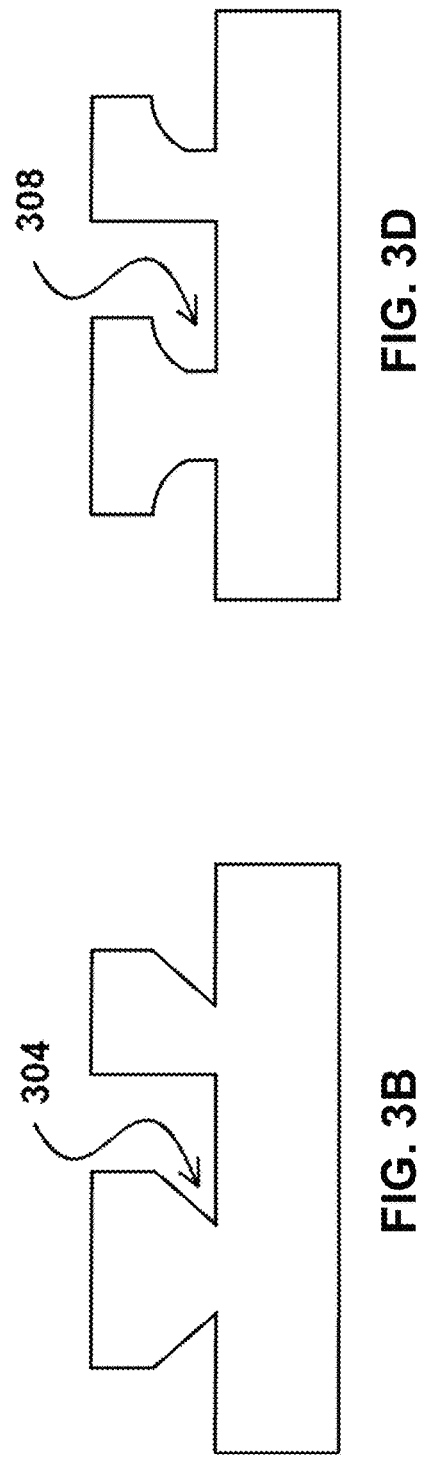

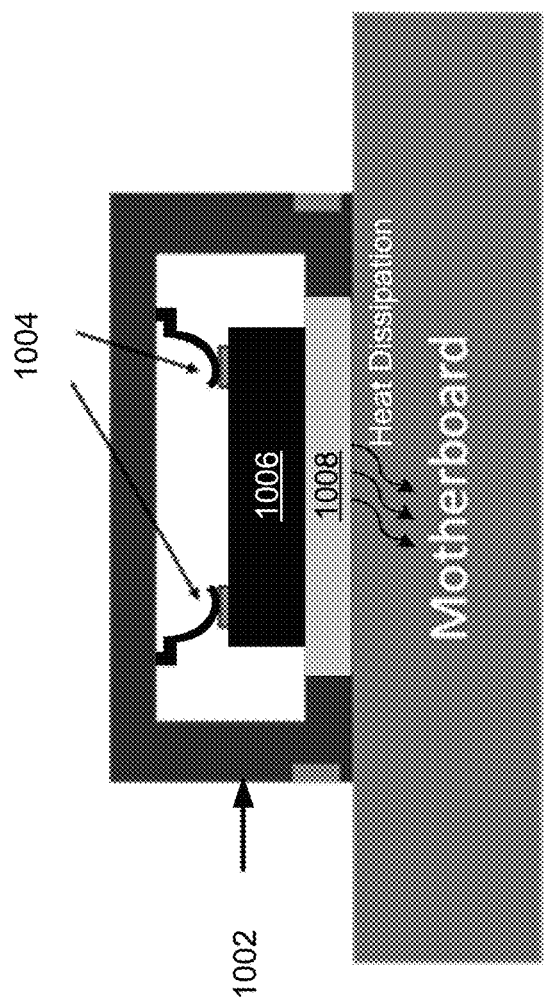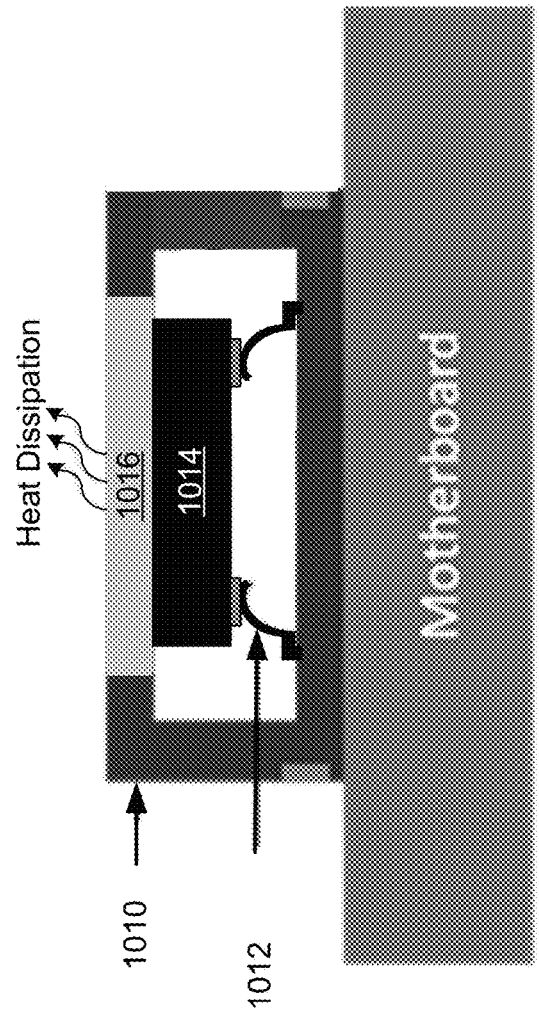

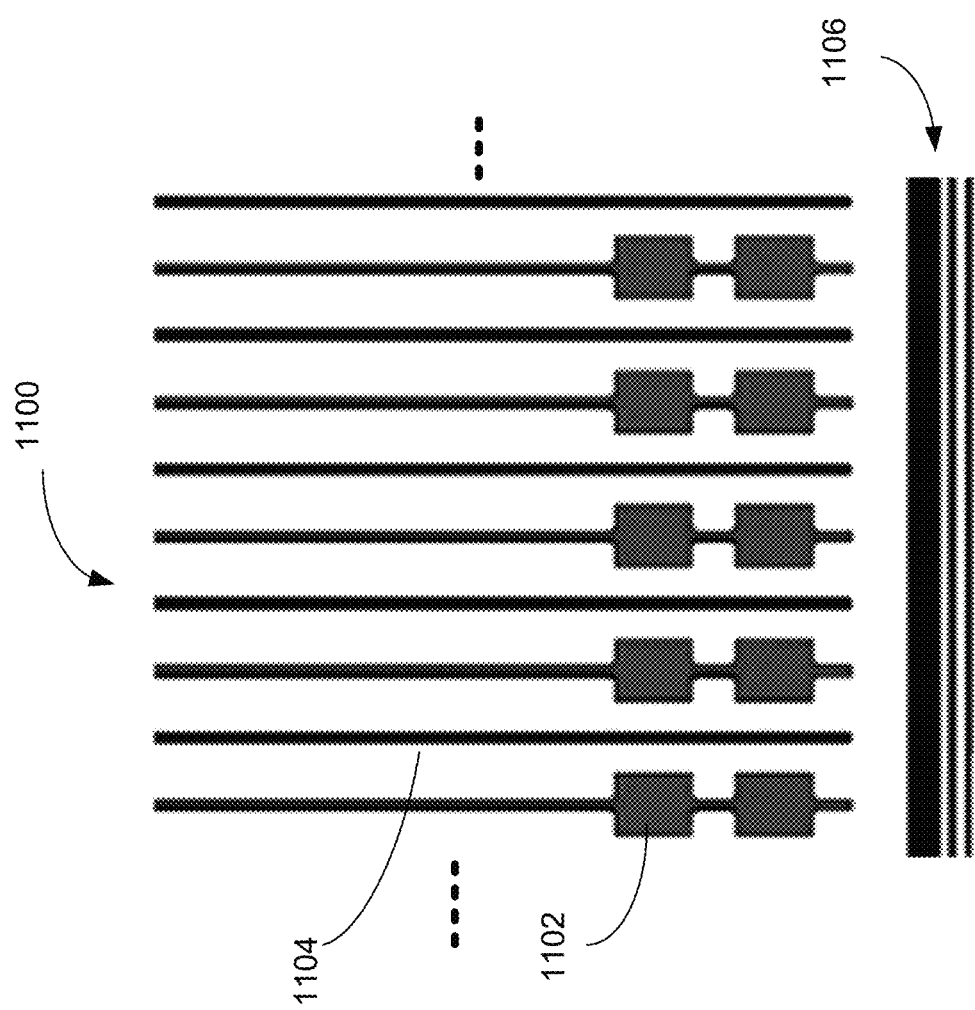

THREE-DIMENSIONAL CIRCUITS WITH FLEXIBLE INTERCONNECTS

CROSS-REFERENCE TO RELATED APPLICATION

This application is a continuation-in-part under 37 C.F.R. 1.53(b) claiming priority to U.S. patent application Ser. No. 17/244,399 entitled "Methods and Processes for Forming Electrical Circuitries on Three-Dimensional Geometries," filed 29 Apr. 2021, and issued as U.S. Pat. No. 11,304,303 on 12 Apr. 2022, which claims priority to U.S. Provisional Patent Application Ser. No. 63/018,001, filed on 30 Apr. 2020, entitled: "Methods and Processes for Forming Electrical Circuitries on Dielectric Three-Dimensional Geometries," the contents of which are hereby incorporated by reference in their entirety as if presented herein in full.

FIELD

This disclosure generally relates to methods for forming three-dimensional (3D) structures with electrical circuits and 3D flexible interconnects (3FIs). The 3FIs enable forming electrical connections with external circuitry. The disclosed technology includes a process for forming isolated regions (traces, interconnects, etc.) of selected material by directional deposition of the selected material on the 3D structures. Undercuts formed in the 3D structure effectively create overhang deposition mask regions that enable defining deposition of a selected material on certain exposed regions of the 3D structure while preventing the selected material from being deposited on regions below the undercuts.

BACKGROUND

Traditional methods of manufacturing circuit boards for use in various electronic circuits typically utilize conductive traces and pads etched from one or more sheets of copper and laminated onto and/or between non-conductive glass-epoxy or other flat substrates. External components (such as integrated circuits, resistors, capacitors, inductors, etc.,) are then electrically and mechanically fastened to the circuit board using solder.

A standard method for producing the desired layout pattern for the conductive traces and non-conductive regions therebetween involves a process similar to photographic development where a conductive surface (such as copper) is coated with a photoresist and exposed with light having the desired pattern that is projected onto the surface, which selectively cures the photoresist in regions where the light impinges. Typically, the photoresist is a monomer that becomes polymerized by the light. The conductive material underneath the light-cured regions of the resist material is protected from dissolution into an etching solution. While this conventional approach of manufacturing can be suitable for mass-production of certain electronic circuits, such circuits are limited to planar geometries with limited feature resolution, can be costly due to the multiple processing steps involved, and can pose a negative environmental impact if the etchants and other chemicals involved are not properly disposed of.

As the chipmaking process has advanced, individual transistors have become so small that further performance improvements require new chip architectures, new chip packaging, and new ways to make interconnections. Multi-part systems-on-a-chip (SoC) employing multiple different elements can be combined onto a single chip, and multi-chip-modules (MCMs) can be interconnected using traditional methods such as wire bonding, which can be utilized to make interconnects between electronic devices and external circuits that have uneven geometries and/or pad height variations. But wire boding requires unimpeded access to both bonding surfaces and is, therefore, typically not suitable for high-density grid-type interconnections. The standard ball-grid array (BGA) processes for making high-density electrical interconnections between electronic devices and external circuits (such as a printed circuit board) can include flow-soldering the BGA to corresponding pad arrays, etc. While flow-soldering BGAs can work well for many planar geometries, it is not suitable for interconnecting components that are temperature-sensitive, or that have curved or uneven mating features.

The need for compliant interconnects has been felt for decades, but the technology never formed a strong foundation due to fundamental manufacturing challenges. Prior efforts, for example, have relied on 2D semiconductor microfabrication technologies (such as the CMOS process) for making planar micro-devices using a silicon substrate, which is a rigid substrate and cannot conformally be applied to curved surfaces in large scale systems. The 2D semiconductor microfabrication technologies impose limits on the design space and can make it challenging to tailor the compliant interconnect to a wide range of applications with different requirements in terms of pitch, scale, warpage, thermal considerations, etc.

New fabrication techniques will be needed to address shortcomings with conventional 2D micro-fabrication and associated interconnection techniques. Recent advancements in MEMS manufacturing have enabled the production of advanced miniature devices, such as multi-axis gyroscopes, microwave circuits, waveguides, etc. However, the ability to produce and interconnect non-planar, three-dimensional (3D) devices remains a challenge. Producing custom 3D parts with dimensional accuracy and precision using a 2D manufacturing process and non-uniform materials is still costly and difficult to achieve if not impossible.

Accordingly, there is a need for improved systems and methods that can overcome the current shape limitations, interconnect limitations, and process complexities associated with traditional planar electronic circuit manufacturing. Embodiments of the present disclosure are directed to this and other considerations.

BRIEF SUMMARY

The disclosed technology includes methods for forming electrical circuitries and three-dimensional flexible interconnects (3FI) on three-dimensional (3D) structures, and devices made using such methods.

According to an exemplary implementation of the disclosed technology, a method is provided for additively manufacturing an electronic device structure. The method includes additively forming and photocuring a 3D structure, the 3D structure characterized by one or more three-dimensional flexible interconnects (3FIs), an upper level, a lower level; and a pedestal portion, the pedestal portion having an undercut. The undercut defines an upper level overhang configured to define a mask region over a portion of the lower level. The method includes forming at least two electrically isolated planes of electronic circuitry by directionally depositing a selected material on the one or more 3FIs, the upper level, and one or more non-masked portions of the lower level.

Consistent with the disclosed embodiments, a three-dimensional (3D) electronic circuit is disclosed that may be fabricated using methods described herein. The 3D electronic circuit can include at least two electrically isolated planes of electrically conductive traces formed by deposition of a selected material on a 3D structure formed by an additive polymer photocuring process. The 3D structure includes an upper level, a lower level, and a pedestal portion joining the upper level and the lower level. The pedestal portions can include an undercut that defines an upper level overhang configured to define a mask region on a corresponding portion of the lower level directly below the upper level overhang to prevent deposition of the selected material on the corresponding portions of the lower level that are masked by the upper level overhang while allowing deposition of the selected material on upper level regions and on lower level regions that are not masked by the upper level overhang.

In certain exemplary implementations, the 3D structure includes one or more three-dimensional flexible interconnects (3FIs) configured to mate under compression and electrically connect with an external circuit. The 3FIs include a fixed anchor portion connected to corresponding one or more of the electrically conductive traces of the 3D electronic circuit, and a compressible mating portion comprising one or more termination regions configured to electrically interface with the external circuit.

According to certain exemplary implementations of the disclosed technology, a three-dimensional (3D) electronically actuatable 3FI device is disclosed that can be fabricated using methods described herein. The 3D electronically actuatable 3FI can include a first coil formed on a first portion of the 3D printed structure. The 3D electronically actuatable 3FI can include a second coil structure suspended above the first coil. Each of the first and second coil are formed on respective electrically isolated planes. The coils include electrically conductive traces formed by deposition of a selected material on a 3D structure formed by an additive polymer photocuring process. The second (suspended) coil structure of the 3D electronically actuatable 3FI is an interconnect configured to flex up or down in response to current in one or more of the coils, such that it can electrically connect with an external circuit. In certain implementations, the second (suspended) coil structure can include a fixed anchor portion connected to corresponding one or more of the electrically conductive traces of the 3D electronic circuit, and a mating portion comprising one or more termination regions configured to electrically interface with the external circuit.

Further features of the disclosed design and the advantages offered thereby are explained in greater detail hereinafter regarding specific embodiments illustrated in the accompanying drawings, wherein like elements are indicated be like reference designators.

BRIEF DESCRIPTION OF THE DRAWINGS

Reference will now be made to the accompanying drawings, which are not necessarily drawn to scale, and which illustrate various implementations and aspects of the disclosed technology and, together with the description, serve to explain the principles of the disclosed technology.

FIG. 3A depicts a cross-sectional side-view illustration of a 3D structure formed and characterized by 90-degree corners, resulting in rectangularly-shaped undercuts 302, in accordance with certain exemplary implementations of the disclosed technology.

FIG. 3B depicts a cross-sectional side-view illustration of a 3D structure formed and characterized by triangular-shaped undercuts 304, in accordance with certain exemplary implementations of the disclosed technology.

FIG. 3C depicts a cross-sectional side-view illustration of a 3D structure formed and characterized by sloped undercuts 306, in accordance with certain exemplary implementations of the disclosed technology.

FIG. 3D depicts a cross-sectional side-view illustration of a 3D structure formed and characterized by curve-shaped undercuts 308, in accordance with certain exemplary implementations of the disclosed technology.

FIG. 10A depicts an example top-connected configuration of a 3D printed package with 3FIs making interconnections to corresponding pads on a top portion of a silicon die, in accordance with certain exemplary implementations of the disclosed technology.

FIG. 10B depicts an example bottom-connected configuration of a 3D printed package with 3FIs making interconnections to corresponding pads on a bottom portion of a silicon die, in accordance with certain exemplary implementations of the disclosed technology.

FIG. 11 depicts bonding pads and circuit traces configured for maintaining a tight pitch of certain example 3FIs along at least one axis, in accordance with certain exemplary implementations of the disclosed technology.

DETAILED DESCRIPTION

Figure 1:
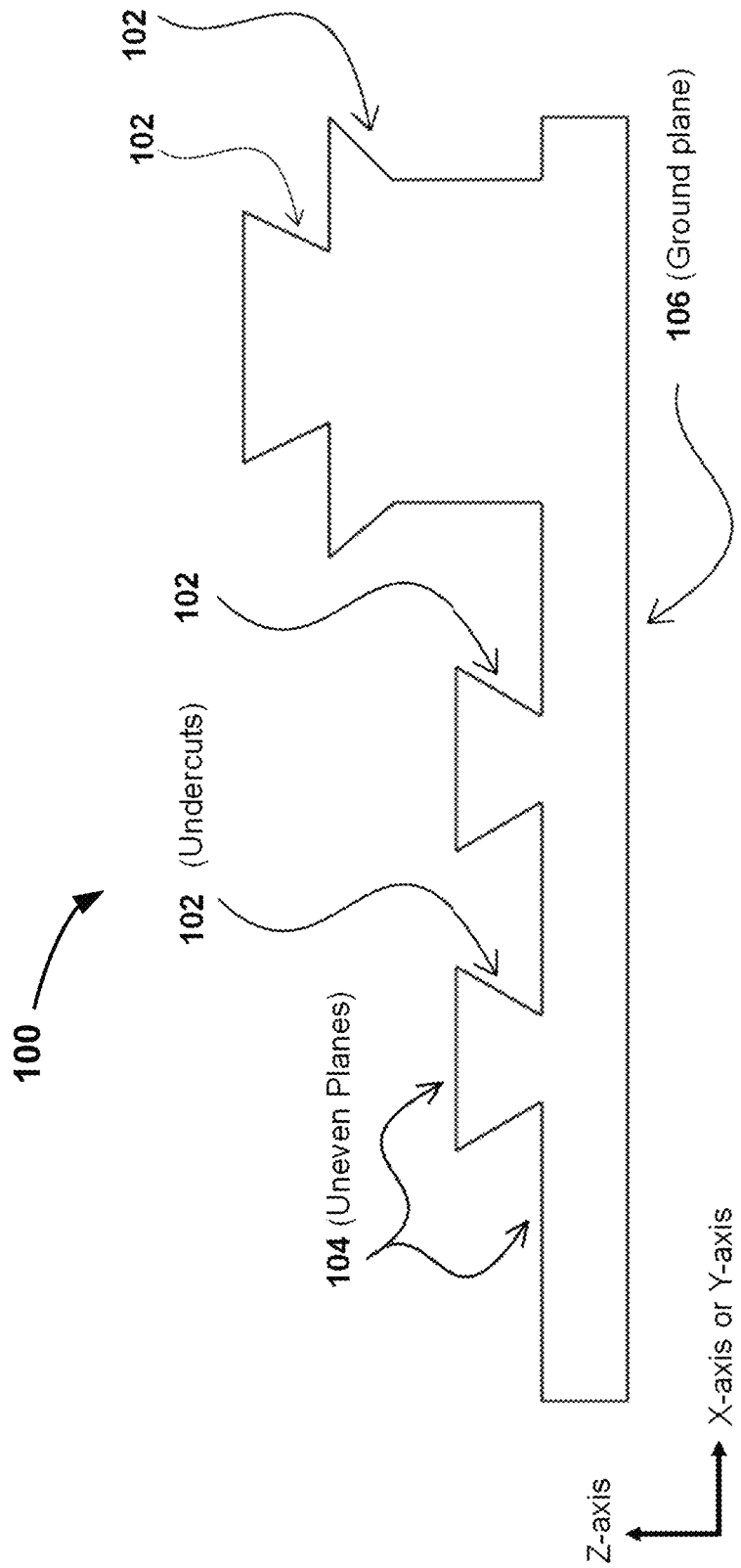
FIG. 1 is a cross-sectional side-view illustration of a three-dimensional (3D) structure 100 having multiple levels and undercuts formed by additive manufacturing, according to certain exemplary embodiments of the disclosed technology.

The disclosed technology includes methods for forming selectively shaped three-dimensional (3D) structures with 3D flexible interconnects (3FIs) using additive manufacturing. Certain processes are disclosed herein for additively forming and photocuring a 3D structure having one or more 3FIs, an upper level, a lower level; and a pedestal portion having an undercut. In certain exemplary implementations, the undercut can define an upper level overhang configured to define a mask region over a portion of the lower level. Electrically isolated planes of electronic circuitry may be formed on the 3D structure by directionally depositing a selected material on the one or more 3FIs, the upper level, and one or more non-masked portions of the lower level.

In certain implementations, the undercuts formed in the 3D structure effectively create overhang deposition masking regions that prevent the selected material from being deposited on regions below the undercuts. The disclosed technology enables the simultaneous formation and electrical isolation of regions in which materials are directionally deposited on the 3D structure using various deposition techniques.

In certain exemplary implementations, the 3FIs may be made using a homogeneous, transverse isotropic material having elastic and elastic-plastic material behaviors. The 3FIs inner material, for example, may be a photo-definable polymeric material. In certain implementations, the polymeric material may have a cured density of 0.041 g/cm3 and a relative permittivity of 2.65. The 3FIs outer material can be made from a variety of different metals, for example, a 10 nm titanium (Ti) adhesion layer may be deposited prior to depositing a 50 nm copper (Cu) seed-layer. A subsequent electroless plating step may be used thicken the seed-layer by depositing an additional 5 μm Cu layer for better electrical conductivity and higher mechanical integrity. The measured electrical conductivity of the metallized 3FIs is approximately 86% of bulk Cu conductivity which is the highest achievable and is similar to conductivity results using standard metallization processes in the state-of-the-art semiconductor foundries.

The disclosed technology may provide one or more of the following advantages:

Low parasitic interconnections: For a 100 μm thick die, the length of a 3FI interconnect from die to package could be as small as <150 μm. In comparison, a relatively short wire bond, in this case, would have a length of 500 μm or longer while more typical wire bond lengths exceed 1 mm. The shorter length interconnects provided by the disclosed 3FIs may reduce parasitics by at least 3-4× since inductive and resistive parasitics are proportional to the length of the interconnect.

Mitigating coefficient of thermal expansion (CTE) mismatch: The mechanical compliance of 3FIs may be engineered to compensate for warpage resulting from CTE mismatch, which can reduce associated strains in the devices and interconnects.

More reliable at higher speed: The disclosed 3D printing technology may utilize a digital-light-processor (DLP) and stereolithography techniques for the parallel 3D printing of interconnects on a silicon die and package-substrate simultaneously, which can significantly reduce the complexities that can arise during wire bonding since the disclosed technology enables 3D printed connections to be monolithically formed on a chip and/or package substrate. Moreover, alignment of interconnects to the die/package can be performed lithographically, providing remarkably high alignment accuracy (<<1 μm).

No Contamination sensitivity: The disclosed 3FI technology requires only physical contact with its mating pad as the flexible interconnect's spring force creates an area-based contact (less sensitivity to oxide contamination, no pulling pressure is exerted on the pad), which provides a larger tolerance to create and maintain reliable electrical connections.

Upgradability: The disclosed 3FI technology may be used to form interconnections based on pressure contacts, which may be non-permanently connected to their mating pads. This feature enables any die or package with 3FIs to easily be replaced, upgraded, or re-worked, facilitating the modularity of a system.

Non-invasive process: Unlike bonding solder-bumps that require thermocompression cycles, 3FIs are pressure contacts, which do not require invasive phase-changing thermocompression bonding, thus avoiding shorting. Furthermore, the disclosed technology may be used to eliminate the problems associated with brittle metallurgical bonds.

No underfill dielectric loss: Unlike solder-bumps that require underfill to stabilize bonds between the silicon chip to a substrate, 3FIs are inherently flexible and compensate for warpage that may incur due to CTE-mismatched interconnecting substrates. Therefore, polymeric underfill material is not needed which is the main source of dielectric loss in high-frequency chips.

Assembly-Free Process: The disclosed technology includes a monolithic-like additive manufacturing scheme that enables 3D printing of the entire electronic package around a silicon die which minimizes (if not eliminates) any post-assembly procedures and prevents many potential failures that occur during conventional heterogeneous integration steps.

Referring now to the figures, exemplary embodiments of the disclosed technology are herein described. It is to be understood that the figures and descriptions of the disclosed technology have been simplified to illustrate elements that are relevant for a clear understanding, while eliminating, for purposes of clarity, other elements found in typical electronics circuits and associated devices. Those of ordinary skill in the art will recognize that other elements may be desirable and/or may be required to implement the disclosed technology. However, because such elements are well known in the art, and because they may not facilitate a better understanding, a discussion of such elements is not provided herein.

FIGS. 1-5 are directed to a basic process for forming electrical circuitries on 3D geometries, as disclosed in U.S. patent application Ser. No. 17/244,399 entitled "Methods and Processes for Forming Electrical Circuitries on Three-Dimensional Geometries," which is hereby incorporated by reference in its entirety as if presented herein in full. FIGS. 6-12 are directed to the 3FI concepts and will be explained in detail below.

FIG. 1 depicts a cross-sectional side-view illustration of a three-dimensional (3D) structure 100 having undercuts 102 and uneven planes 104 according to certain exemplary embodiments of the disclosed technology. In this example embodiment, four separate (top-facing) planes and a (bottom-facing) ground plane 106 are depicted.

In accordance with certain exemplary implementations of the disclosed technology, the 3D structure 100 may be formed by various additive manufacturing processes, including but not limited to Fused Deposition Modeling (FDM), Binder Jetting Printing (BJP), Digital Light Projection (DLP), Continuous Digital Light Projection (CDLP), Continuous Liquid Interface Production (CLIP), Two-Photon Printing (2PP), and or classic Stereolithography (SLA).

In one exemplary implementation of the disclosed technology, a DLP 3D printer may be utilized in a top-down additive process in which the curing device (light projector) is located underneath a translucent resin bath. When starting a print, a build platform is submerged at the bottom of the bath and moves up incrementally during the printing process. The size of the increment determines the thickness of each layer. The first layer of the printed object is solidified using the light from the projector, which causes it to stick to the build platform. The platform rises and the whole process repeats iteratively, creating a solid object as a result. In other exemplary implementations, the process may utilize a bottom-up additive process.

In accordance with certain exemplary implementations of the disclosed technology, one or more commercial photodefinable resins/polymers may be utilized in the additive process to create the 3D structure 100, including but not limited to SLA and DLP photopolymers, diacrylate based liquid photopolymers (such as IP-S, and/or IP-DIP), SU8 photopolymer, acrylate-based photopolymers (such as PROTO-GRAY), etc.

According to certain exemplary embodiments, forming the 3D structure 100 can include utilizing one or more of photodefinable polymeric material photocuring, photodefinable non-polymeric material photocuring, and a mixture of photodefinable polymeric material and non-polymeric material.

According to certain exemplary embodiment, the additive manufacturing process may utilize the above-mentioned (and/or other) 3D printing techniques to provide layer thickness and/or features over a wide range of different scales. The nano-scale process using 2PP, for example, may produce layer thickness and/or minimum feature sizes ranging in dimensions from about 50 nm to about 800 nm. The high-resolution micron-scale process using DLP, for example, may produce layer thickness and/or minimum feature sizes ranging in dimensions from about 0.9 µm to about 20 µm. The low-resolution micron-scale process using SLA or BJP, for example, may produce layer thickness and/or minimum feature sizes ranging in dimensions from about 20 µm to about 50 µm. The macro-scale process using FDM, for example, may produce layer thickness and/or minimum feature sizes ranging in dimensions from about 50 µm to about 200 µm. Thus, a wide range of additive 3D printing capabilities may be employed to produce the 3D structures described herein, ranging from tens of nm scale to tens of mm scale.

Certain exemplary implementations of the disclosed technology may include depositing a selected material with a layer thickness at different scales.

A nano-scale process, for example, may utilize physical and/or chemical vapor deposition to produce a layer thickness ranging from about 1 nm to about 300 nm.

A high-resolution micron-scale process, for example, may utilize physical and/or chemical vapor deposition to produce a layer thickness ranging from about 200 nm to about 1 µm.

A low-resolution micron-scale process, for example, may utilize directional sputtering to produce a layer thickness ranging from about 200 nm to about 1 µm.

A macro-scale process, using spray coating, for example, may produce a layer thickness ranging from about 2 µm to about 10 µm.

Figure 2:
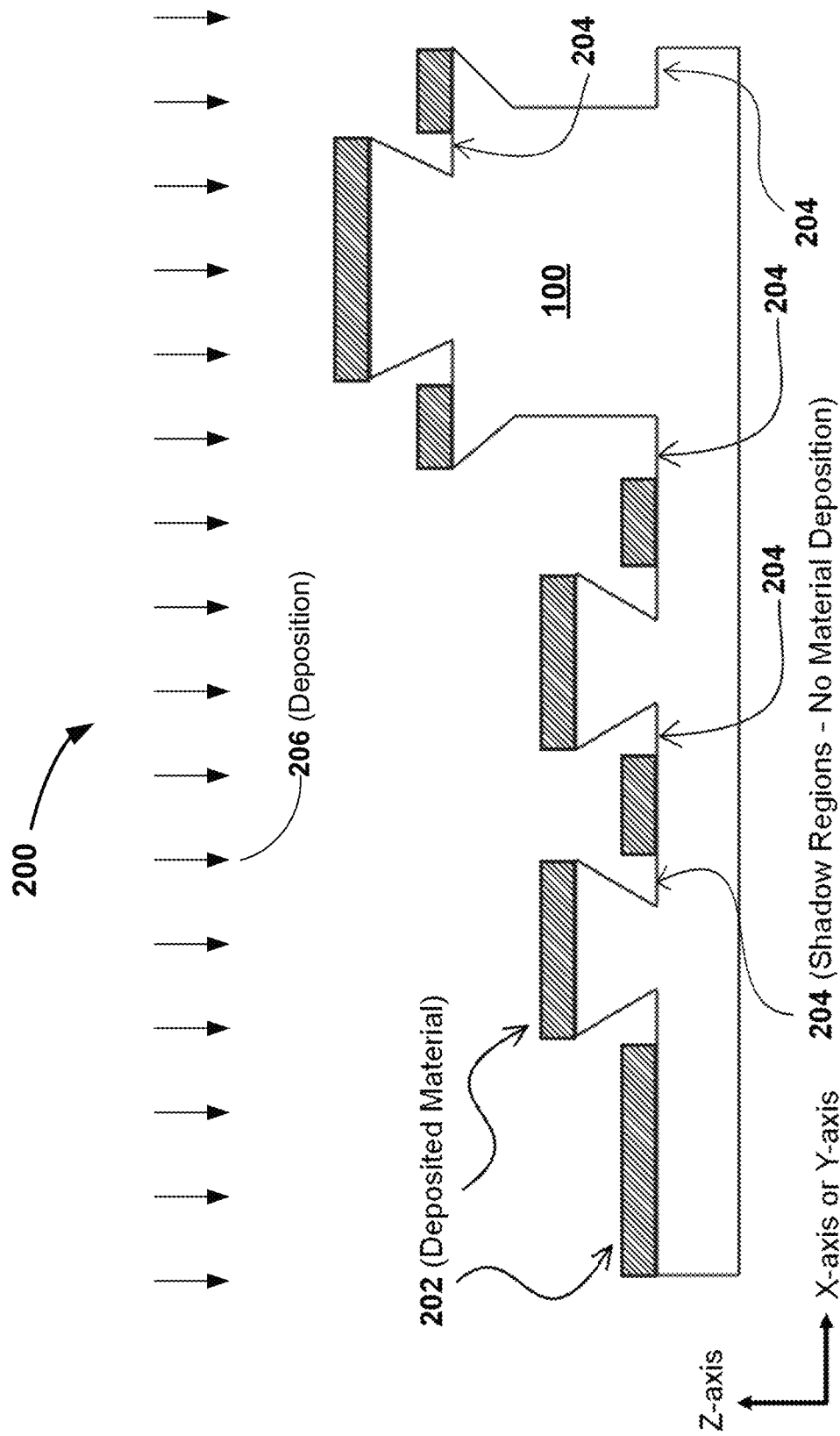
FIG. 2 illustrates a deposition process 200 in which a selected material is directionally deposited on a 3D structure (for example, the 3D structure 100 as shown in FIG. 1) using various physical and chemical deposition techniques. Certain embodiments of the process 200 may be utilized to simultaneously create regions of deposited material separated by regions having no material deposition.

FIG. 2 illustrates an exemplary deposition process 200 that may be utilized to deposit a selected material on a printed 3D structure 100 (as discussed above with reference to FIG. 1) to simultaneously form multiple regions of deposited material 202 that may be isolated (electrically, thermally, mechanically, etc.,) from one another by shadow regions 204 in which no material is deposited due to the material deposition 206 being blocked by the undercuts (such as undercuts 102 shown in FIG. 1). According to an exemplary embodiment, the selected material may be directionally deposited 206 on the 3D structure 100 using various deposition techniques, including, but not limited to deposition processes such as sputtering, thermal evaporation, electroless-plating, electro-plating, chemical vapor deposition, spray coating, and aerosol jet printing. In accordance with certain exemplary implementations of the disclosed technology, an angle of deposition 206 may be selected to range from about 0 degrees to about 90 degrees with respect to a top surface of the 3D structure 100.

As depicted in FIG. 2, the selected material may be deposited 202 on at least the upper level(s) and non-masked portions of the lower level(s) where the non-masked portions of the lower level(s) are not masked or blocked by the undercuts 102 and/or the resulting associated overhang(s) of the upper level(s).

In accordance with certain exemplary implementations of the disclosed technology, the selected material for deposition 206 can include one or more of an adhesion material, an electrically conductive material, a semiconductor material, an electrical insulator material, a thermally conductive material, and a thermally non-conductive material. In accordance with certain exemplary implementations of the disclosed technology, the selected material for deposition 206 can include metal(s) and/or metal alloy(s). In certain exemplary implementations, the material selected for deposition 206 may include, without limitation, titanium, tin alloys, Gallium alloys, copper, silver, gold silicon-oxides, and nitrides. In certain exemplary implementations, titanium may be deposited and act as an adhesion material to enhance the adhesion of additional layers of other selected materials deposited on top of the titanium. In certain exemplary implementations, gold may be utilized to form a top layer to reduce oxidation.

In certain exemplary implementations, the selected material for deposition 206 can include dielectric materials, including but not limited to any oxide(s), such as $Cu_xO_y$, $Al_xO_y$, $Si_xO_y$, graphite-oxide, etc.

In certain exemplary implementations, the selected material for deposition 206 can include any nitride(s), such as $Ti_xN_y$, $Si_xN_y$, etc.

In certain exemplary implementations, the selected material for deposition 206 can include any non-photopolymer(s), such as PLA and ABS In certain exemplary implementations, the selected material for deposition 206 can include any of the above-mentioned photopolymers.

In certain exemplary implementations, the selected material for deposition 206 can include any non-ferro metal(s), such as Al, Ti, Cu, Pb, etc.

In certain exemplary implementations, the selected material for deposition 206 can include any ferro metal(s), such as Fe, Ni, etc.

In certain exemplary implementations, the selected material for deposition 206 can include any noble metal(s), such as Au, Ag, Pt, etc.

In certain exemplary implementations, the selected material for deposition 206 can include any carbon-based material(s), such as graphite, graphene, etc.

In certain implementations, the process 200 may include depositing an electrically conductive material on at least the upper level(s) and non-masked portions of the lower level(s) to form at least two electrically conductive traces that are electrically isolated from one another by at least the masked (or shadow 204) portions of the lower level.

In accordance with certain exemplary implementations of the disclosed technology, the deposited material(s) 202 may undergo thermal and/or mechanical treatment, which may include annealing, compression, ultrasonic welding, etc. For example, in the case where the deposited material 202 forms electrically conductive traces, the traces may be annealed, thermally treated, mechanically treated, etc., to enhance thermal and mechanical properties and/or to enhance binding with one or more of external metal wires, C4 microbumps of a chip, pins, and metal leads.

In certain implementations, a thickness of the deposited material 202 may be reduced by one or more of vapor etching, chemical etching, chemical-mechanical-polishing, and reactive-ion-etching.

According to an exemplary implementation of the disclosed technology, the selected material may be deposited on one or more of a top surface, a bottom surface, a slope, a flat surface, and a curvature of the 3D structure 100.

In accordance with certain exemplary implementations of the disclosed technology, various undercut geometries 300 may be produced in the 3D structure (such as the 3D structure 100 as shown and discussed above with reference to FIG. 1 and/or FIG. 1). Certain exemplary undercut geometries 300 will now be discussed with reference to FIGS. 3A, 3B, 3C, and 3D, however additional undercut geometries not shown are within the scope of the disclosed technology.

FIG. 3A depicts a cross-sectional side-view illustration of a 3D structure formed and characterized by 90-degree corners, resulting in rectangularly-shaped undercuts 302, in accordance with certain exemplary implementations of the disclosed technology.

FIG. 3B depicts a cross-sectional side-view illustration of a 3D structure formed and characterized by triangular-shaped undercuts 304, in accordance with certain exemplary implementations of the disclosed technology.

FIG. 3C depicts a cross-sectional side-view illustration of a 3D structure formed and characterized by sloped undercuts 306, in accordance with certain exemplary implementations of the disclosed technology.

FIG. 3D depicts a cross-sectional side-view illustration of a 3D structure formed and characterized by curve-shaped undercuts 308, in accordance with certain exemplary implementations of the disclosed technology.

Figure 4:
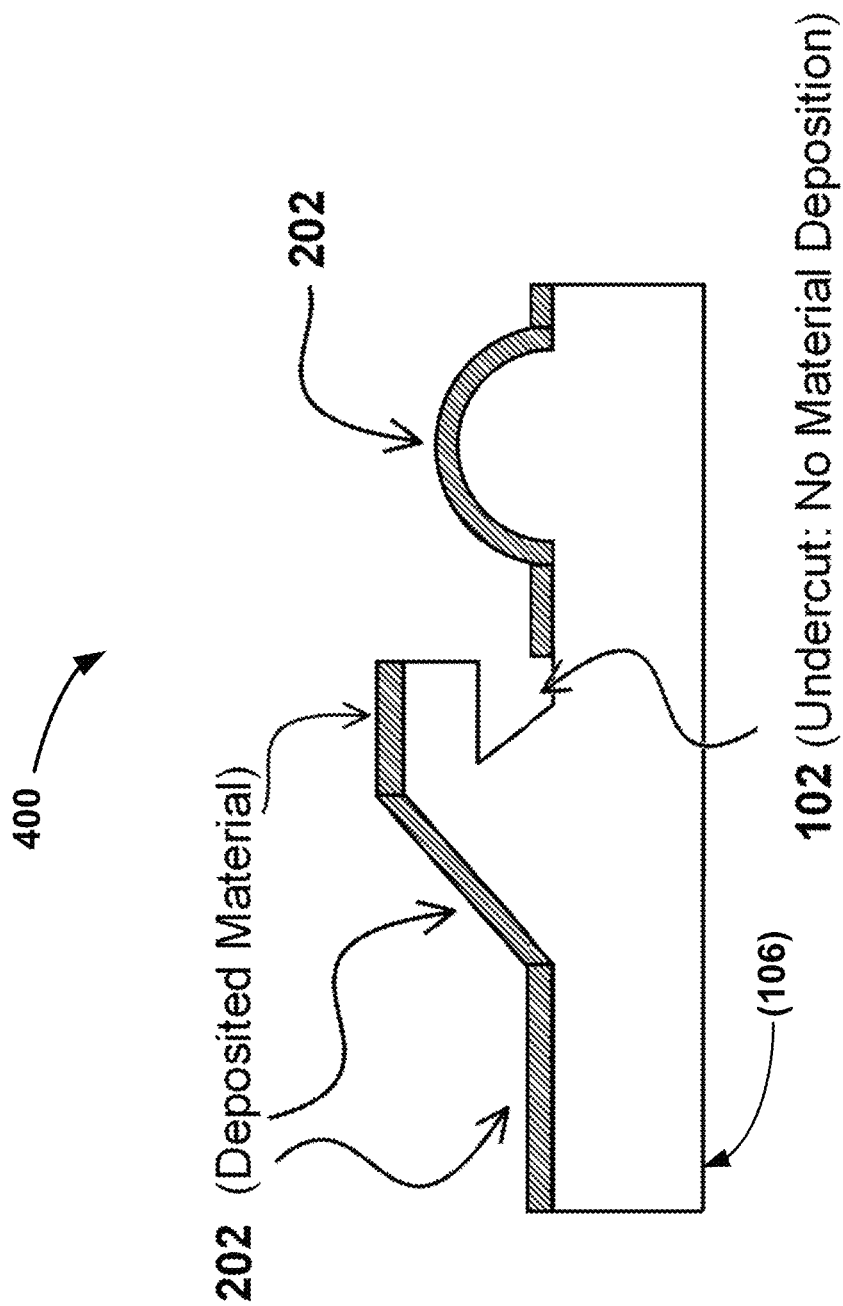
FIG. 4 depicts a cross-sectional side-view illustration of selected material deposited on surfaces of a 3D structure 400 having flat, sloped, and curved portions, in accordance with certain exemplary implementations of the disclosed technology.

FIG. 4 depicts a cross-sectional side-view illustration of selected material deposited on surfaces of a 3D structure 400 having flat, sloped, and curved portions, in accordance with certain exemplary implementations of the disclosed technology.

In accordance with certain exemplary implementations of the disclosed technology, the undercut geometries may be characterized by one or more of sloped steps, reverse curvatures, 90° angle steps, and a combination of sloped steps and a 90° angle step.

FIG. 4 depicts a cross-sectional side-view illustration of selected material deposited on surfaces of a 3D structure 400 having flat, sloped, and curved portions, in accordance with certain exemplary implementations of the disclosed technology.

In accordance with certain exemplary implementations of the disclosed technology, the 3D structure 400 may be configured to be compressible to create a spring force. The undercut 102, for example, as shown in FIG. 4, may be utilized to define and produce an overhang region than may be compressible.

Figure 5:
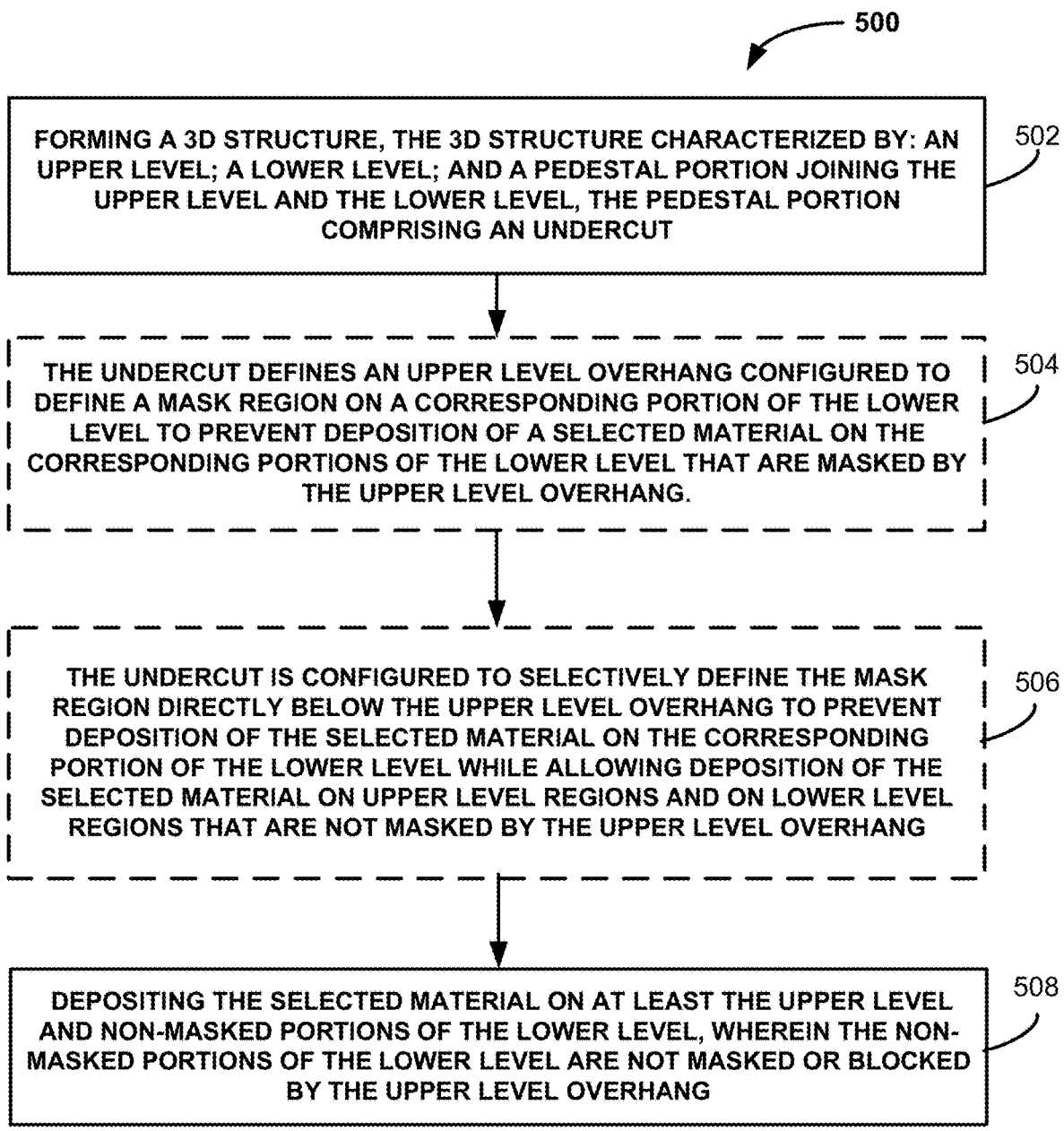
FIG. 5 is a flow diagram of a method 500, according to an exemplary implementation of the disclosed technology.

FIG. 5 is a flow diagram of a method 500 for additively manufacturing an electronic device structure, according to an exemplary implementation of the disclosed technology. In block 502, the method 500 includes forming a 3D structure, the 3D structure characterized by an upper level; a lower level; and a pedestal portion joining the upper level and the lower level, the pedestal portion comprising an undercut.

In descriptive block 504, the undercut defines an upper level overhang configured to define a mask region on a corresponding portion of the lower level to prevent deposition of a selected material on the corresponding portions of the lower level that are masked by the upper level overhang.

In descriptive block 506, the undercut is configured to selectively define the mask region directly below the upper level overhang to prevent deposition of the selected material on the corresponding portion of the lower level while allowing deposition of the selected material on upper level regions and on lower level regions that are not masked by the upper level overhang.

In block 508, the method 500 includes depositing the selected material on at least the upper level and non-masked portions of the lower level, wherein the non-masked portions of the lower level are not masked or blocked by the upper level overhang.

Figure 6:
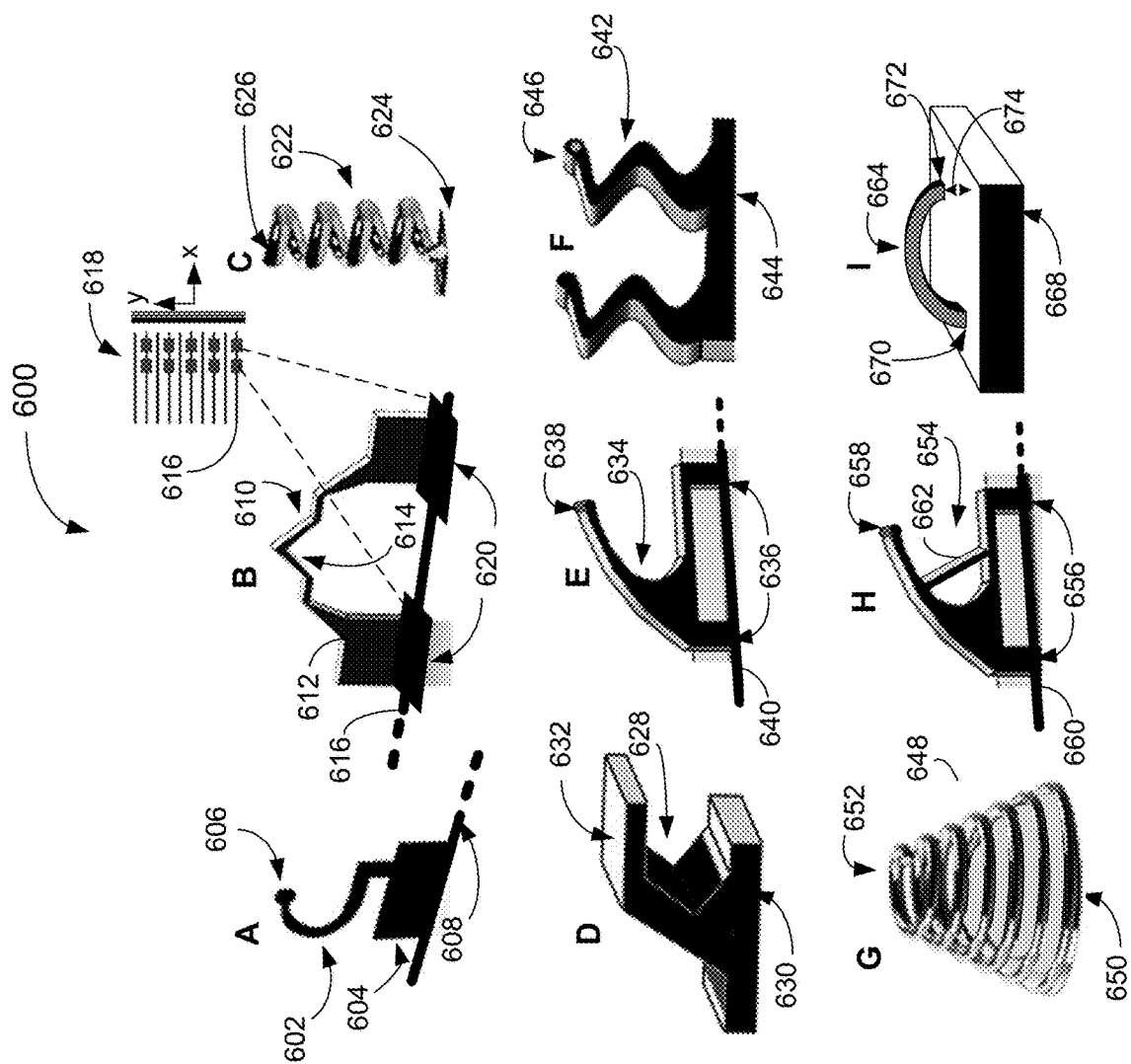
FIG. 6 depicts several example 3FI shape configurations 600 (A-I) that may be manufactured with the additive process, coated with a selected material, and utilized to provide flexible and/or force-type interconnections between the 3D structure and an external device or circuit.

FIG. 6 depicts several example 3FI shape configurations 600 (A-I) that may be manufactured with the processes disclosed herein. In certain implementations, the 3FIs may be formed as part of, or in addition to, the underlying 3D structure (as discussed in FIGS. 1-4) to provide a monolithic structure. In accordance with certain exemplary implementations of the disclosed technology, the 3D structure with the 3FI may be coated with a selected conductive material and utilized to provide flexible and/or force-type interconnections between the defined electrical traces of the 3D structure and corresponding contact pads of an external device or circuit. While the underlying 3D structure, the external device or circuit, and the corresponding conductive pads on the external device or circuit are not shown in the configurations 600 (A-I), example arrangements of these parts are depicted in FIGS. 7-10 and will be discussed below.

While only example 3FI shape configurations 600 A, B, E, and H explicitly depict electrical traces 608 616 640 660, it should be understood that the example 3FI shape configurations 600 C-I also connect electrically to electrical traces and are mechanically connected to the rest of the underlying 3D structure. It should also be understood that additional 3FIs (including arrays) may be defined in the 3D structure for making multiple force electrical connections with the external circuit. In certain exemplary implementations, multiple 3FIs may be utilized to complete a single electrical connection with the external circuit for enhanced reliability, redundancy, and/or reduced contact resistance with the external circuit.

The example 3FI shape configuration "A" shown in FIG. 6 may have a defining hook-shaped portion 602 and a single fixed base portion 604. The base portion 604 may be mechanically fixed to the underlying 3D structure (not shown) and electrically connected to an electrical trace 608 defined in the underlying 3D structure. The hook-shaped portion 602 may be configured to compress under force and rebound approximately to its initial shape when the compressive force is removed. In certain exemplary implementations, this configuration may have a terminal portion 606 configured for electrically connecting the trace 608 with an external circuit via a corresponding conductive pad on the external circuit.

The example 3FI shape configuration "B" shown in FIG. 6 may have a defining bridge-shaped portion 610 supported by two or more base portions 612. The base portions 612 may be mechanically fixed to the underlying 3D structure and electrically connected to an electrical trace 612 defined in the underlying 3D structure. The bridge-shaped portion 610 of this 3FI may be configured to compress under force and rebound approximately to its initial shape when the compressive force is removed. In certain exemplary implementations, this configuration may have a (terminal portion) tip 614 configured for electrically connecting with an external circuit, for example, via a corresponding conductive pad on the external circuit.

In certain exemplary implementations, the example 3FI shape configuration "B" may exhibit a minimum x-y expansion when the tip 614 is mated under compression with an external circuit. This example 3FI shape configuration is depicted to show its electrical/mechanical connections to the circuit trace 616 and underlying pads 620 of circuitry 618 defined on the underlying 3D structure using the methods disclosed herein. This design may exhibit linear behavior in stress, strain, and/or displacement curves under load. Certain implementations of this example 3FI shape configuration "B" may be particularly suited for connecting with external circuits (such as silicon strip detector) where fan-out pads are positioned at the periphery and where the tight pitch is required along the y-axis but not the x-axis of the circuitry 618 defined on the underlying 3D structure.

The example 3FI shape configuration "C" shown in FIG. 6 may have a defining spring-shaped portion 622 and a base portion 624. The base portion 624 may be mechanically fixed to the underlying 3D structure (not shown) and electrically connected to an electrical trace defined in the underlying 3D structure. The spring-shaped portion 622 may be configured to compress under force and rebound approximately to its initial shape when the compressive force is removed. In certain exemplary implementations, this configuration may have a terminal portion 626 configured for electrically connecting with an external circuit.

The example 3FI shape configuration "D" shown in FIG. 6 may have a defining arm-shaped portion 628 and a base portion 630. The base portion 630 may be mechanically fixed to the underlying 3D structure (not shown) and electrically connected to an electrical trace defined in the underlying 3D structure. The arm-shaped portion 628 may be configured to compress under force and rebound approximately to its initial shape when the compressive force is removed. In certain exemplary implementations, this configuration may have a terminal portion 632 configured for electrically connecting with an external circuit.

The example 3FI shape configuration "E" shown in FIG. 6 may have a defining arm-shaped portion 634 supported by two or more base portions 636. The base portion(s) 636 may be mechanically fixed to the underlying 3D structure (not shown) and electrically connected to an electrical trace 640 defined in the underlying 3D structure. The arm-shaped portion 634 may be configured to compress under force and rebound approximately to its initial shape when the compressive force is removed. In certain exemplary implementations, this configuration may have a terminal portion 638 configured for electrically connecting with an external circuit.

The example 3FI shape configuration "F" shown in FIG. 6 may have two or more defining accordion-shaped portions 642 supported by a common base portion 644. The base portion 644 may be mechanically fixed to the underlying 3D structure (not shown) and electrically connected to an electrical trace defined in the underlying 3D structure. The accordion-shaped portions 642, for example, may be configured to compress under force and rebound approximately to its initial shape when the compressive force is removed. In certain exemplary implementations, this configuration may have a terminal portion 646 configured for electrically connecting with an external circuit. In accordance with certain exemplary implementations of the disclosed technology, multiple accordion-shaped portions 642 may be utilized to complete an electrical connection with the external circuit for enhanced reliability, redundancy, and/or reduced contact resistance with the external circuit. Alternate embodiments of the example 3FI shape configuration "F" having dual compressible and terminal portions (but without the accordion shape) will be further discussed below with reference to FIG. 7.

The example 3FI shape configuration "G" shown in FIG. 6 may have a defining helical or spring-shaped portion 648 and a base portion 650. The base portion 650 may be mechanically fixed to the underlying 3D structure (not shown) and electrically connected to an electrical trace defined in the underlying 3D structure. The helical or spring-shaped portion 648 may be configured to compress under force and rebound approximately to its initial shape when the compressive force is removed. In certain exemplary implementations, this configuration may have a terminal portion 652 configured for electrically connecting with an external circuit.

The example 3FI shape configuration "H" shown in FIG. 6 may have a defining arm-shaped portion 654 supported by two or more base portions 656. The base portion(s) 656 may be mechanically fixed to the underlying 3D structure (not shown) and electrically connected to an electrical trace 660 defined in the underlying 3D structure. The arm-shaped portion 654 may be configured to compress under force and rebound approximately to its initial shape when the compressive force is removed. In certain exemplary implementations, this configuration may have a terminal portion 658 configured for electrically connecting with an external circuit. This example 3FI shape configuration may be similar to the example 3FI shape configuration "E" described above, but with an extra brace portion 662, for example to provide additional support or stiffness to the arm portion 654.

The example 3FI shape configuration "I" shown in FIG. 6 may have a defining C-shaped portion 664 and a base portion 668. The base portion 668 may be mechanically fixed to the underlying 3D structure (not shown) and electrically connected to an electrical trace defined in the underlying 3D structure. The C-shaped portion 664 may be configured to compress under force and rebound approximately to its initial shape when the compressive force is removed. In certain exemplary implementations, this configuration may have a terminal portion defined approximately midway on the top surface of the C-shaped portion 664 and configured for electrically connecting with an external circuit. In certain exemplary implementations, a first end 670 of the C-shaped portion 664 may be mechanically and electrically connected to the base portion 668, while the second end 672 may be configured to be free, having a clearance 674 above the base portion 668. In this example implementation, as the C-shaped portion 664 is compressed, the second end 672 may approach the top of the base portion 668. Under sufficient compression the second end 672 may touch the base portion 668, which in turn may require additional force to further compress the C-shaped portion 664. Thus, certain example implementations of the 3FIs may be designed with multi-level force specifications to impart a greater contact force between the terminal portion and an external circuit as the 3FI is compressed beyond a predetermined value. In certain exemplary implementations (not shown) the second end 672 may be attached to the base portion 668. Certain implementations may include a double arch configuration as will be discussed below with respect to the example 3FI configuration of FIG. 8.

As may be appreciated, the disclosed technology is not limited to the example 3FI configurations discussed herein. Many other 3FI shapes may be made using the disclosed technology.

Figure 7:
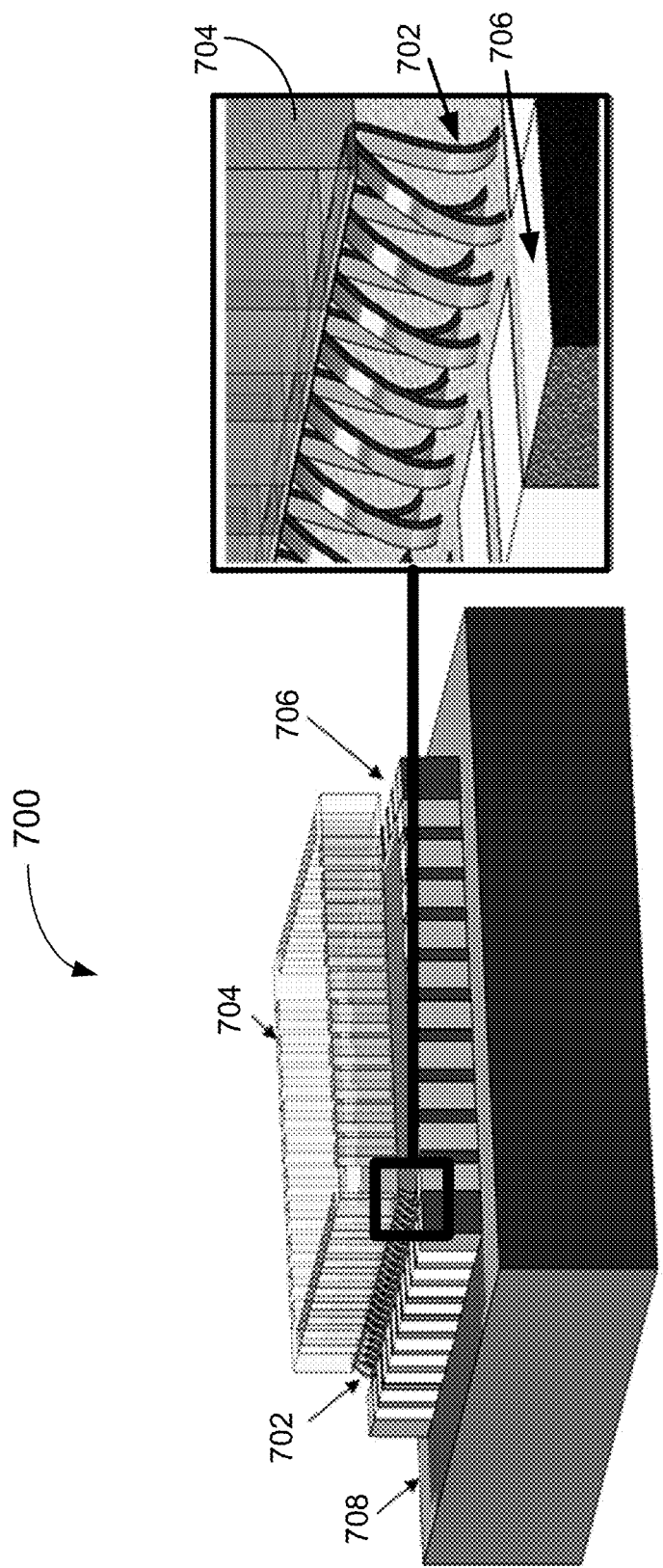
FIG. 7 depicts an example electronic package 700 that utilizes embedded 3FIs to provide interconnections between a sensor die and a package substrate, in accordance with certain exemplary implementations of the disclosed technology.

FIG. 7 depicts an example electronic package 700 use-case that utilizes embedded 3FIs 702 to provide multiple simultaneous interconnections between a chip die 704 (such as a sensor die) and a package substrate 706, in accordance with certain exemplary implementations of the disclosed technology. In this example use-case implementation, the substrate 706 may be considered an "external circuit" while the die 704 and embedded 3FIs 702 may be fabricated using techniques disclosed herein and configured for mating under compression with the substrate 706. In certain exemplary implementations, the substrate 706 may be disposed on a circuit board 708 such as a motherboard. In accordance with certain exemplary implementations of the disclosed technology, the 3D printed 3FIs 702 may be utilized to interconnect a silicon chip or (other integrated circuit or device) to the package substrate 706 by leveraging the hybrid dielectric-metal 3D printing process disclosed herein to build mechanically compliant 3D structures that are electrically conductive. The 3D printed 3FIs 702 may be designed with a spring force to create interconnections between the die 704 and the package substrate 706. In certain exemplary implementations, the shape configuration of the example 3FIs 702 for this use-case may be as shown in FIG. 7. In other exemplary implementations, the 3FI 702 for this use-case may be similar to the shape configuration "F" shown in FIG. 6. In other exemplary implementations, the 3FI 702 for this use-case may be similar to any one of the shape configurations shown in FIG. 6.

Figure 8:
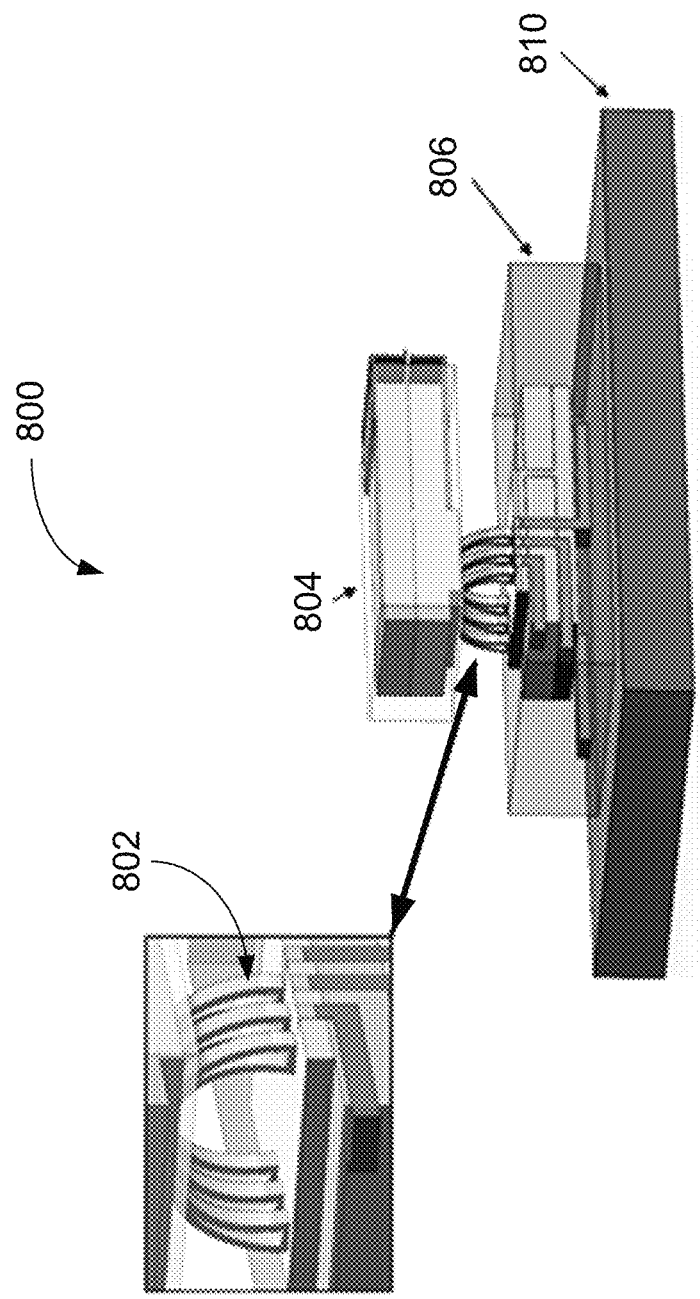
FIG. 8 depicts an example use of multiple arch-shaped 3FIs to provide interconnections between a sensor and readout electronics, in accordance with certain exemplary implementations of the disclosed technology.

FIG. 8 depicts an example use-case 800 in which an array 802 of arch-shaped 3FIs may be utilized to provide interconnections between a hybrid photodetector (HPD) sensor 804 and multi-pixel readout electronics 806, in accordance with certain exemplary implementations of the disclosed technology. In certain exemplary implementations, the multi-pixel readout electronics 806 may be disposed on a circuit board 810. In certain exemplary implementations, 3D printed compliant 3FIs 802 can be tailored to suit a specific application.

Figure 9:
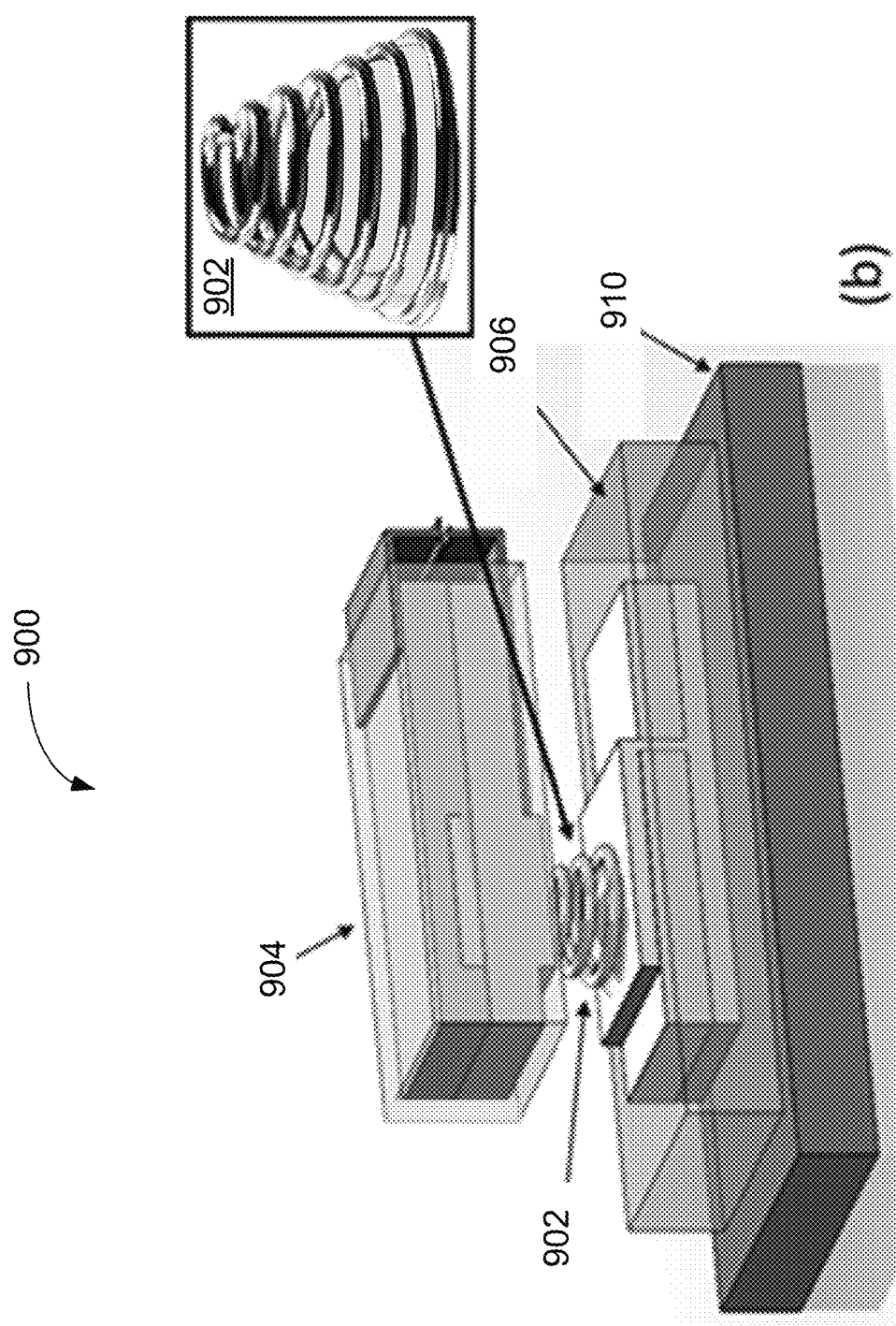
FIG. 9 depicts an example use of a helical-shaped 3FI to provide an interconnection between a sensor and readout electronics, in accordance with certain exemplary implementations of the disclosed technology.

FIG. 9 depicts an example use-case 900 in which a single helical-shaped 3FI 902 may be utilized to provide an interconnection between a sensor 904 and readout electronics 906, in accordance with certain exemplary implementations of the disclosed technology. In certain exemplary implementations, the readout electronics 906 may be disposed on a circuit board 910. In certain exemplary implementations, the 3D printed compliant helical-shaped 3FI 902 may represent a radical design that cannot be achieved using the CMOS process. Helical structures, such as the helical-shaped 3FI 902 (and shape "G" as discussed above with reference to FIG. 6), for example, are among those geometries that cannot be patterned using traditional lithographic masks. Such geometries an also nearly impossible to be manufactured at the micron-scale using traditional methods.

As may be appreciated by those having skill in the art, helical structures (such as the helical-shaped 3FI 902) may be particularly suited for use as on-chip inductors for noise rejection or power delivery, In accordance with certain exemplary implementations of the disclosed technology.

The 3D printing technology and methods disclosed herein enable the manufacturing of 3D mechanically flexible interconnects (3FI) for electronic packaging to connect a silicon chip to a package substrate. The hybrid dielectric-metal 3D printing process disclosed herein allows for a wide range of metals and dielectrics. The package substrate along with interconnections and encapsulation can be monolithically 3D printed, hence eliminating certain (or all) post-processing steps. The monolithic-like integration of 3FIs with electronic packages provides a wide design space and integration flexibility for different applications. For instance, some applications require top-mounted heatsinks, which can benefit from the disclosed technology since 3FIs can be configured to connect the silicon die at a face-down position. Conversely, other applications may require heat to be dissipated via a motherboard. Certain exemplary implementations of the disclosed technology may provide solutions to both of these configurations as will now be discussed with reference to FIG. 10A and FIG. 10B.

FIG. 10A depicts an example top-connected (face up) configuration of a 3D printed package 1002 having 3D printed 3FIs 1004 configured for making flexible and/or force-compressible-type interconnections to corresponding pads on a top portion of a silicon die 1006, in accordance with certain exemplary implementations of the disclosed technology. In an exemplary implementation, a heat-conductive substrate 1008 may be formed in the 3D printed package 1002 and may be disposed between the silicon die 1006 and a motherboard, for example, to provide a heat dissipation path through the bottom portion of the silicon die 1006 via the conductive substrate 1008 and into the motherboard. In certain exemplary implementations, the heat-conductive substrate 1008 may be 3D printed along with the 3D printed package 1002 and selectively coated with a selected heat-conducting coating. In certain exemplary implementations, the 3D printed package 1002 may be printed around and integrated with a separate heat-conductive substrate 1008.

FIG. 10B depicts an example bottom-connected (face down) configuration of a 3D printed package 1010 having 3D printed 3FIs 1012 configured for making flexible and/or force-compression-type interconnections to corresponding pads on a bottom portion of a silicon die 1014, in accordance with certain exemplary implementations of the disclosed technology. In an exemplary implementation, a heat-conductive substrate 1016 may be formed in the 3D printed package 1010 and may be disposed on top of the silicon die 1014 for example, to provide a heat dissipation path through the top portion of the silicon die 1014 via the conductive substrate 1016 and to the surrounding environment. In certain exemplary implementations, the heat-conductive substrate 1016 may be 3D printed along with the 3D printed package 1010 and selectively coated with a selected heat-conducting coating. In certain exemplary implementations, the 3D printed package 1010 may be printed around and integrated with a separate heat-conductive substrate 1016.

FIG. 11 depicts a circuit 1100 with bonding pads 1102 and circuit traces 1104 fabricated using methods described herein and configured for maintaining a tight pitch of certain example 3FIs along at least one axis, in accordance with certain exemplary implementations of the disclosed technology. Certain implementation of this circuit 1100 are depicted in FIG. 6 (618) to illustrate a use for interfacing with certain 3FIs.

Figure 12:
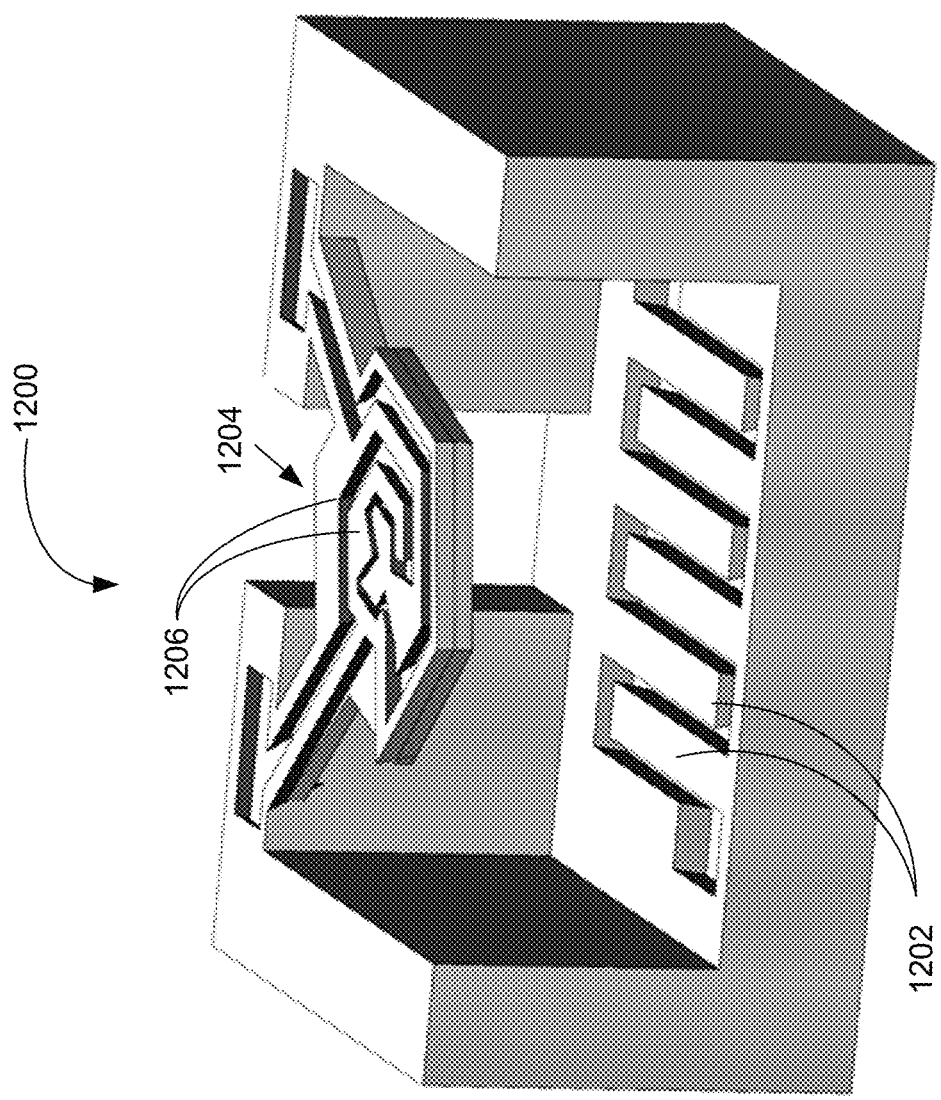
FIG. 12 depicts a three-dimensional (3D) electronically actuatable 3FI device, in accordance with certain example implementations of the disclosed technology.

FIG. 12 depicts a three-dimensional (3D) electronically actuatable 3FI device 1200, in accordance with certain example implementations of the disclosed technology. The actuatable device 1200 may be fabricated using methods described herein. The 3D electronically actuatable 3FI device 1200 can include a first coil structure 1202 formed on a first portion of the 3D printed structure. In certain example implementations, the first coil structure 1202 can be on a fixed portion of the device 1200. In certain example implementations, the first coil structure 1202 can include serpentine-like or interdigitated fingers. In other implementations, the first coil structure 1202 can be a planar or 3D coil structure. The 3D electronically actuatable 3FI can include a second coil structure 1204, for example, that can be suspended above the first coil structure 1202. Each of the first coil structure 1202 and second coil structure 1204 may be formed on respective electrically isolated planes of the device 1200. Each of the first coil structure 1202 and second coil structure 1204 may include electrically conductive traces formed by deposition of a selected material on a 3D structure formed by an additive polymer photocuring process as disclosed herein. In accordance with certain example implementations of the disclosed technology, the second coil structure 1204 may include or be embodied as an interconnect that is configured to flex up or down in response to electromagnetic interaction between the coils 1204 1202. For example, a current in one or more of the first coil structure 1202 and second coil structure 1204 may be used to selectively control the interconnect so that can selectively electrically connect with an external circuit. In this respect, the three-dimensional (3D) electronically actuatable 3FI device 1200 may act as a controllable switch that may be used to complete a circuit. In certain implementations, the second (suspended) coil structure 1204 can include a fixed anchor portion connected to corresponding one or more of the electrically conductive traces of the 3D electronic circuit, and a mating portion comprising one or more termination regions configured to electrically interface with the external circuit.

Figure 13:
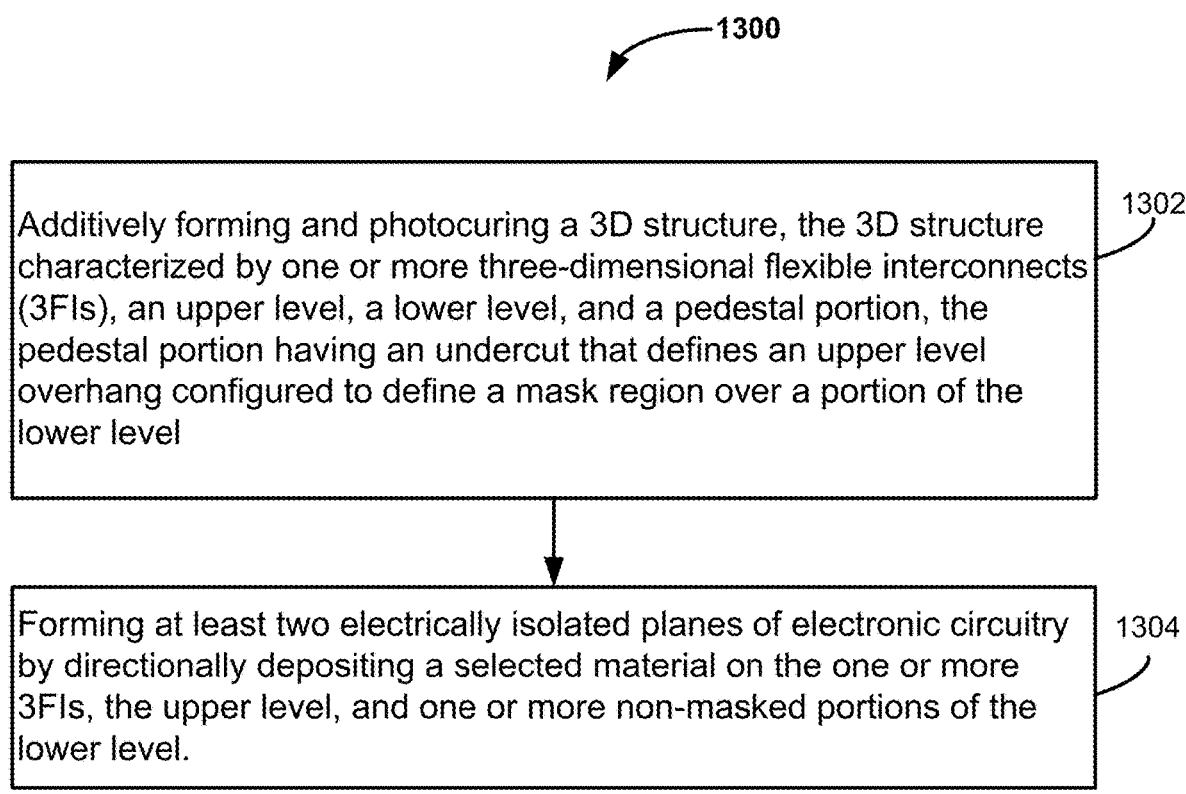
FIG. 13 is a flow diagram of a method 1200, according to an exemplary implementation of the disclosed technology.

FIG. 13 is a flow diagram of a method 1300 for additively manufacturing a three-dimensional (3D) electronic circuit device structure. In block 1302, the method 1300 includes additively forming and photocuring a 3D structure, the 3D structure characterized by one or more three-dimensional flexible interconnects (3FIs), an upper level, a lower level, and a pedestal portion, the pedestal portion having an undercut that defines an upper level overhang configured to define a mask region over a portion of the lower level. In block 1304 the method 1300 includes forming at least two electrically isolated planes of electronic circuitry by directionally depositing a selected material on the one or more 3FIs, the upper level, and one or more non-masked portions of the lower level.

In certain exemplary implementations, the one or more 3FIs are configured to mate under compression with an external circuit and electrically connect corresponding one or more traces of the electronic circuitry of the 3D electronic circuit with the external circuit.

Certain exemplary implementations may further include placing the 3D electronic circuit device structure against the external circuit such that at least a portion of the one or more 3FIs is in an individually compressed state and electrically connected to corresponding conductive regions of the external circuit.

According to an exemplary implementation of the disclosed technology, additively forming and photocuring the one or more 3FIs of the 3D structure can include forming one or more of a hook structure, a bridge structure, a helical structure, as spring structure, a finger structure, an arm structure, an accordion structure, a C-shaped structure, and a bridge structure. In certain implementations, each structure can include a fixed anchor portion, a compressible portion, and a mating portion.

In accordance with certain exemplary implementations of the disclosed technology, directionally depositing the selected material can include depositing an electrically conductive material on at least the one or more 3FIs, at least a portion of the upper level, and the one or more non-masked portions of the lower level to form at least two electrically conductive traces that are electrically isolated from one another by at least-masked portions of the lower level masked by the upper lever overhang.

In certain exemplary implementations, the selected material can include one or more of a metal, a metal alloy, an adhesion material, an electrically conductive material, a semiconductor material, an electrical insulator material, a thermally conductive material, and a thermally non-conductive material.

In accordance with certain exemplary implementations of the disclosed technology, forming the 3D structure can include one or more of photocuring a photodefinable polymeric material, photocuring a photodefinable non-polymeric material, and photocuring mixture of photodefinable polymeric material and non-polymeric material.

In certain exemplary implementations, the selected material can include one or more of sputtering, thermal evaporation, spray coating, and aerosol jet printing, where the angle of deposition may be selected from a range of 0 degrees to 90 degrees with respect to a top surface of the 3D structure.

Certain exemplary implementations of the disclosed technology can include forming or stacking and electrically connecting a 3D superstrate structure or external circuit on one or more of a top, a bottom, and a side of the 3D structure using one or more of additive manufacturing, 3D printing, and heterogeneous assembly.

In accordance with certain exemplary implementations of the disclosed technology, the electronic circuitry may be formed without requiring thermocompression cycles. In certain exemplary implementations, the electronic circuitry may be formed without requiring an underfill dielectric.

Certain exemplary implementations of the disclosed technology can include increasing the thickness of the deposited selected material by one or more of electroless-plating, electro-plating, and chemical vapor deposition. Certain exemplary implementations of the disclosed technology can include reducing the thickness of the deposited selected material by one or more of vapor etching, chemical etching, chemical-mechanical-polishing, and reactive-ion-etching.

In accordance with certain exemplary implementations of the disclosed technology, a three-dimensional (3D) electronic circuit may be fabricated using methods described herein. The 3D electronic circuit can include at least two electrically isolated planes of electrically conductive traces formed by deposition of a selected material on a 3D structure formed by an additive polymer photocuring process. The 3D structure includes an upper level, a lower level, and a pedestal portion joining the upper level and the lower level. The pedestal portions can include an undercut that defines an upper level overhang configured to define a mask region on a corresponding portion of the lower level directly below the upper level overhang to prevent deposition of the selected material on the corresponding portions of the lower level that are masked by the upper level overhang while allowing deposition of the selected material on upper level regions and on lower level regions that are not masked by the upper level overhang.

In certain exemplary implementations, the 3D structure includes one or more three-dimensional flexible interconnects (3FIs) configured to mate under compression and electrically connect with an external circuit. The 3FIs include a fixed anchor portion connected to corresponding one or more of the electrically conductive traces of the 3D electronic circuit, and a compressible mating portion comprising one or more termination regions configured to electrically interface with the external circuit. In certain exemplary implementations, the pedestal portion may define at least one of the one or more 3FIs.

In certain exemplary implementations, the undercut may define an upper level overhang configured to define a mask region on a corresponding portion of the lower level directly below the upper level overhang to prevent deposition of the selected material on the corresponding portions of the lower level that are masked by the upper level overhang while allowing deposition of the selected material on upper level regions and on lower level regions that are not masked by the upper level overhang. The electrically conductive traces may be selectively isolated from one another by one or more of the mask region and the undercut.

In accordance with certain exemplary implementations of the disclosed technology, depositing the selected material can include one or more of sputtering, thermal evaporation, electroless-plating, electro-plating, chemical vapor deposition, spray coating, and aerosol jet printing. In certain implementations, the angle of deposition may be selected from a range of 0 degrees to 90 degrees with respect to a top surface of the 3D structure.

In certain exemplary implementations, the selected material can include one or more of a metal, a metal alloy, an adhesion material, an electrically conductive material, a semiconductor material, an electrical insulator material, a thermally conductive material, and a thermally non-conductive material.

Certain exemplary implementations of the disclosed technology can include reducing the thickness of the deposited selected material by one or more of vapor etching, chemical etching, chemical-mechanical-polishing, and reactive-ion-etching. In certain implementations where stray material has formed in unwanted regions (due to deposition overspray, processing errors, etc., for example), the above-referenced techniques may be utilized to remove thin layers of the stray material while only slightly reducing the thickness of the material in regions where it was intended to be deposited.

An upper level and the lower level of the 3D structure manufactured using methods discussed herein may be characterized by one of more of a planar surface, a slope, and a curvature.

In accordance with certain exemplary implementations of the disclosed technology, forming the 3D structure can include utilizing one or more of photodefinable polymeric material photocuring, photodefinable non-polymeric material photocuring, and a mixture of photodefinable polymeric material and non-polymeric material.

According to certain exemplary implementations, the undercut discussed and shown herein may be characterized by one or more of sloped steps, reverse curvatures, 90° angle steps, and combination of sloped steps and a 90° angle step.

In certain exemplary implementations, the selected material may be deposited on one or more of a top surface, a bottom surface, a slope, a flat surface, and a curvature of the 3D structure.

In accordance with certain exemplary implementations of the disclosed technology, the 3D structure and the undercuts discussed herein may be configured to be compressible to create a spring force.

Certain exemplary implementations may include depositing an electrically conductive material on at least the upper level and non-masked portions of the lower level to form at least two electrically conductive traces that are electrically isolated from one another by at least the masked portions of the lower level.

Certain exemplary implementations may include one or more of annealing, thermally treating, and mechanically treating at least one of the electrically conductive traces to enhance thermal and mechanical properties and to enhance binding with one or more of external metal wires, C4 micro-bumps of a chip, pins, and metal leads. In certain implementations, any deposited material (conductive or otherwise) may be treated to enhance durability, adhesion, etc.

Certain exemplary implementations may include forming or stacking a 3D superstrate structure on one or more of a top, a bottom, and a side of the 3D structure using one or more of additive manufacturing, 3D printing, and heterogeneous assembly. In accordance with certain exemplary implementations of the disclosed technology, the 3D superstrate structure and the 3D structure may be electrically connected.

In accordance with certain exemplary implementations of the disclosed technology, a three-dimensional (3D) electronic circuit may be fabricated using methods described herein. The 3D electronic circuit can include electrically conductive traces formed by deposition of a selected material on a 3D structure that is formed by an additive manufacturing process (such as multilevel polymer photocuring). The 3D structure can include an upper level, a lower level, and a pedestal portion joining the upper level and the lower level. An undercut may be selectively formed in the pedestal portions. The undercut can define an upper level overhang that is configured to define a mask region on a corresponding portion of the lower level to prevent deposition of the selected material on the corresponding portions of the lower level that are masked by the upper level overhang.

The electrically conductive traces may be selectively isolated from one another by one or more of the mask region and the undercut, and the undercut may be configured to selectively define the mask region directly below the upper level overhang to prevent deposition of the selected material on the corresponding portion of the lower level while allowing deposition of the selected material on upper level regions and on lower level regions that are not masked by the upper level overhang.

In accordance with certain exemplary implementations of the disclosed technology, the selected material utilized for fabricating the three-dimensional (3D) electronic circuit can include one or more of an adhesion material, an electrically conductive material, a semiconductor material, an electrical insulator material, a thermally conductive material, and a thermally non-conductive material. In certain implementations, the selected material comprises one or more of metal and metal alloys.

In certain implementations, one or more of the upper level and the lower level of the 3D electronic circuit may be characterized by one or more of a planar surface, a slope, and a curvature, and wherein the undercut is characterized by one or more of sloped steps, reverse curvatures, 90° angle steps, and combination of sloped steps and a 90° angle step.

In accordance with certain exemplary implementations of the disclosed technology, one or more undercuts of a 3D electronic circuit may be configured to cause at least a portion of the 3D electronic circuit to be compressible to create a spring force.

In certain exemplary implementations, the electrically conductive traces are thermally and mechanically treated to bind with one or more of external metal wires, C4 microbumps of a chip, pins, and metal leads.

In accordance with certain exemplary implementations of the disclosed technology, a 3D superstrate structure may be formed or stacked on one or more of a top, a bottom, and a side of the 3D structure, wherein the 3D superstrate structure and the 3D structure may be electrically connected.

As may be readily apparent to those having skill in the art, the methods disclosed here may enable metallization and microfabrication techniques that are compatible with 3D printing, and that enable the simultaneous microfabrication of multiple electrical connections. Such techniques disclosed herein may be utilized in a wide variety of applications, including but not limited to the 3D construction of Micro-Electromechanical Systems (MEMS), micro-antennas, etc.

The 3D printing and deposition methods disclosed herein demonstrate a beneficial fabrication technology that virtually exhibits no limitations as to what can be printed. Conventional microfabrication technology, on the other hand, is heavily bounded and influenced by standardized processes such as CMOS, hence optimized for fabricating 2D layouts rather than 3D structures. Thus, the disclosed invention is an enabling technology that can pave the way to utilize 3D printing for electronic applications and can address pitch, height, and geometry limitations imposed by conventional 2D microfabrication technologies.

Moreover, the techniques disclosed herein may be used to construct nearly any 3D structure, thus providing viable microfabrication techniques for building 3D microdevices (e.g., 3D antennas). Enabled by the techniques disclosed herein and employing 3D printing, it is feasible to tailor the shapes, height, and pitch of the devices with improved electrical and mechanical properties.

In certain implementations disclosed herein, a polymer may be utilized to 3D print a structure that is electrically non-conductive. A subsequent metallization process may be utilized to create electrical connections. Unlike conventional microfabrication methods that employ a subsequent patterning step (i.e., photoresist coating, lithography, and development) to form metal traces and connections, the technology disclosed herein does not require any additional patterning for defining electrical paths. This lithography-free approach enables the production of additively manufactured microdevices that can be designed with special shapes.

The combination of high-resolution 3D printing of polymers and the lithography-free metallization process disclosed herein is an enabling technology for making 3D-antennas and other microdevices. The disclosed technology provides manufacturing flexibilities that address the fundamental limitations for building 3D devices due to shortcomings with conventional microfabrication technologies.

Certain example implementation of the disclosed technology may provide the technical effects and/or benefits of enabling the formation of circuitry on complex-shaped 3D structures. The disclosed technology removes certain geometrical limitations and provides several advantages over traditional planar circuit processing techniques, including but not limited to reducing one or more processing steps. The disclosed technology enables the simultaneous formation and electrical isolation of regions in which materials are directionally deposited on the 3D structure using deposition techniques. In this respect, certain steps in traditional circuit board processing can be avoided, such as spinning a photoresist on a copper-coated substrate, exposing the photoresist to light, etching the copper, etc.

Certain example implementations of the disclosed technology include an electronically actuatable 3FI device that may be fabricated using methods described herein. Such devices can include two coils formed on respective electrically isolated planes of the device and may include electrically conductive traces formed by deposition of a selected material on a 3D structure formed by an additive polymer photocuring process as disclosed herein. One of the coil structures may include an interconnect that is configured to flex up or down in response to electromagnetic interaction between the coils. For example, a current in one or more of the first coil structure and second coil structure may be used to selectively control the interconnect so that can selectively electrically connect with an external circuit. In this respect, the three-dimensional (3D) electronically actuatable 3FI device may act as a controllable switch that may be used to complete a circuit.

Although preferred embodiments of the disclosed technology are explained in detail, it is to be understood that other embodiments are contemplated. Accordingly, it is not intended that the disclosed technology is limited in its scope to the details of construction and arrangement of components set forth in the following description or illustrated in the drawings. The disclosed technology is capable of other embodiments and of being practiced or carried out in various ways. As used in the specification and the appended claims, the singular forms "a," "an," and "the" include plural referents unless the context dictates otherwise.

It is intended that each term presented herein contemplates its broadest meaning as understood by those skilled in the art and may include all technical equivalents, which operate similarly to accomplish a similar purpose.

Ranges may be expressed herein as from "about" or "approximately" one particular value and/or to "about" or "approximately" another particular value. When such a range is expressed, another embodiment may include from the one particular value and/or to the other particular value. Similarly, values may be expressed herein as "about" or "approximately."

The terms "comprising" or "containing" or "including" means that at least the named element, material, or method step is present in the apparatus or method, but does not exclude the presence of other elements, materials, and/or method steps, even if the other elements, materials, and/or method steps have the same function as what is named.

The term "exemplary" as used herein is intended to mean "example" rather than "best" or "optimum."

Numerous characteristics and advantages have been set forth in the foregoing description, together with details of structure and function. While the disclosed technology has been presented in several forms herein, it may be apparent to those skilled in the art that many modifications, additions, and deletions, especially in matters of shape, size, and arrangement of parts, can be made therein without departing from the spirit and scope of the disclosure and its equivalents as set forth in the following claims. Therefore, other modifications or embodiments as may be suggested by the teachings herein are particularly reserved as they fall within the breadth and scope of the claims.

I claim:

1. A three-dimensional (3D) electronic circuit, comprising:
at least two electrically isolated planes of electrically conductive traces formed by deposition of a selected material on a 3D structure formed by an additive polymer photocuring process, the 3D structure comprising:
an upper level comprising a first set of the electrically conductive traces;
a lower level comprising a second set of the electrically conductive traces that are electrically isolated from the electrically conductive traces of the upper level; and
a pedestal portion directly joining the upper level and the lower level, the pedestal portions comprising an undercut;
wherein the first set of the electrically conductive traces at the upper level, the pedestal portion, and the second set of the electrically conductive traces at the lower level form the 3D electronic circuit.

2. The 3D electronic circuit of claim 1, wherein the undercut defines an upper level overhang configured to define a mask region on a corresponding portion of the lower level directly below the upper level overhang to prevent deposition of the selected material on the corresponding portions of the lower level that are masked by the upper level overhang while allowing deposition of the selected material on upper level regions and on lower level regions that are not masked by the upper level overhang.

3. The 3D electronic circuit of claim 2, wherein the electrically conductive traces are selectively isolated from one another by one or more of the mask region and the undercut.

4. The 3D electronic circuit of claim 1, wherein the selected material comprises one or more of a metal, a metal alloy, an adhesion material, an electrically conductive material, a semiconductor material, an electrical insulator material, a thermally conductive material, and a thermally non-conductive material.

5. The 3D electronic circuit of claim 1, wherein one or more of the upper level and the lower level are characterized by one of more of a planar surface, a slope, and a curvature, and wherein the undercut is characterized by one or more of sloped steps, reverse curvatures, 90° angle steps, and combination of sloped steps and a 90° angle step.

6. The 3D electronic circuit of claim 1, further comprising a 3D superstrate structure formed or stacked on one or more of a top, a bottom, and a side of the 3D structure.

7. The 3D electronic circuit of claim 1, wherein at least a portion of the 3D structure is compressible and configured to create a spring force under compression.

8. The 3D electronic circuit of claim 1, wherein the 3D structure further comprises one or more three-dimensional flexible interconnects (3FIs) configured to mate under compression and electrically connect with an external circuit.

9. The 3D electronic circuit of claim 8, wherein the pedestal portion defines at least one of the one or more 3FIs.

10. The 3D electronic circuit of claim 8, wherein the 3FIs comprise one or more of a helical structure, a finger structure, an arm structure, and a bridge structure, each structure comprising:
a fixed anchor portion connected to corresponding one or more of the electrically conductive traces of the 3D electronic circuit; and
a compressible mating portion comprising one or more termination regions configured to electrically interface with the external circuit.

11. A method of additively manufacturing a three-dimensional (3D) electronic circuit device structure, the method comprising:
additively forming and photocuring a 3D structure, the 3D structure is characterized by:
one or more three-dimensional flexible interconnects (3FIs);
an upper level comprising a first set of electrically conductive traces;
a lower level comprising a second set of electrically conductive traces that are electrically isolated from the first set of electrically conductive traces of the upper level; and
a pedestal portion directly joining the upper level and the lower level, the pedestal portion comprising an undercut, wherein the undercut defines an upper level overhang configured to define a mask region over a portion of the lower level; and
forming at least two electrically isolated planes of electronic circuitry by directionally depositing a selected material on the one or more 3FIs, the upper level, and one or more non-masked portions of the lower level, wherein the first set of the electrically conductive traces at the upper level, the pedestal portion, and the second set of the electrically conductive traces at the lower level form the 3D electronic circuit.

12. The method of claim 11, wherein the one or more 3FIs are configured to mate under compression with an external circuit and electrically connect corresponding one or more traces of the electronic circuitry of the 3D electronic circuit with the external circuit.

13. The method of claim 12, further comprising placing the 3D electronic circuit device structure against the external circuit such that at least a portion of the one or more 3FIs are in an individually compressed state and electrically connected to corresponding conductive regions of the external circuit.

14. The method of claim 11, wherein additively forming and photocuring the one or more 3FIs of the 3D structure comprises forming one or more of a hook structure, a bridge structure, a helical structure, as spring structure, a finger structure, an arm structure, an accordion structure, a C-shaped structure, and a bridge structure, each structure comprising a fixed anchor portion, a compressible portion, and a mating portion.

15. The method of claim 11, wherein directionally depositing the selected material comprises depositing an electrically conductive material on at least the one or more 3FIs, at least a portion of the upper level, and the one or more non-masked portions of the lower level to form at least two electrically conductive traces that are electrically isolated from one another by at least-masked portions of the lower level masked by the upper level overhang.

16. The method of claim 11, wherein the selected material comprises one or more of a metal, a metal alloy, an adhesion material, an electrically conductive material, a semiconductor material, an electrical insulator material, a thermally conductive material, and a thermally non-conductive material.

17. The method of claim 11:
wherein forming the 3D structure comprises one or more of photocuring a photodefinable polymeric material, photocuring a photodefinable non-polymeric material, and photocuring mixture of photodefinable polymeric material and non-polymeric material;

wherein the directionally depositing the selected material further comprises one or more of sputtering, thermal evaporation, spray coating, and aerosol jet printing; and wherein an angle of deposition is selected from a range of 0 degrees to 90 degrees with respect to a top surface of the 3D structure.

18. The method of claim 11, further comprising forming or stacking and electrically connecting a 3D superstrate structure or external circuit on one or more of a top, a bottom, and a side of the 3D structure using one or more of additive manufacturing, 3D printing, and heterogeneous assembly.

19. The method of claim 11, wherein the electronic circuitry is formed without requiring thermocompression cycles and without requiring an underfill dielectric.

20. The method of claim 11, further comprising one or more of:

increasing a thickness of the deposited selected material by one or more of electroless-plating, electro-plating, and chemical vapor deposition; or reducing a thickness of the deposited selected material by one or more of vapor etching, chemical etching, chemical-mechanical-polishing, and reactive-ion-etching.

\* \* \* \* \*